(12) United States Patent
Wang et al.

(10) Patent No.: US 10,032,713 B2
(45) Date of Patent: Jul. 24, 2018

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Yung-Chih Wang, Taoyuan (TW); Carlos H. Diaz, Mountain View, CA (US); Tien-Lu Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/007,532

(22) Filed: Jan. 27, 2016

(65) Prior Publication Data
US 2017/0213790 A1 Jul. 27, 2017

(51) Int. Cl.
| | | |
|---|---|---|
| *H01L 23/522* | (2006.01) | |
| *H01L 21/768* | (2006.01) | |
| *H01L 23/528* | (2006.01) | |
| H01L 23/532 | (2006.01) | |
| H01L 27/22 | (2006.01) | |

(52) U.S. Cl.
CPC .... *H01L 23/5226* (2013.01); *H01L 21/76804* (2013.01); *H01L 21/76816* (2013.01); *H01L 21/76877* (2013.01); *H01L 23/528* (2013.01); *H01L 23/53295* (2013.01); *H01L 27/228* (2013.01)

(58) Field of Classification Search
None
See application file for complete search history.

(56) References Cited

U.S. PATENT DOCUMENTS

| | | | | |
|---|---|---|---|---|
| 2003/0015741 A1* | 1/2003 | Lee | ................... | H01L 21/76802 257/295 |
| 2003/0049903 A1* | 3/2003 | Mitani | .............. | H01L 21/76802 438/253 |
| 2005/0266636 A1* | 12/2005 | Kitamura | .......... | H01L 21/76838 438/241 |
| 2010/0061132 A1* | 3/2010 | Fujisaki | ............. | G11C 13/0004 365/51 |
| 2013/0075733 A1* | 3/2013 | Saito | ................... | H01L 29/7869 257/57 |

\* cited by examiner

*Primary Examiner* — Marc Armand
*Assistant Examiner* — Sue Tang
(74) *Attorney, Agent, or Firm* — McClure, Qualey & Rodack, LLP

(57) ABSTRACT

A semiconductor device structure is provided. The semiconductor device structure includes a semiconductor substrate. The semiconductor device structure includes a first conductive plug and a second conductive plug over the semiconductor substrate and adjacent to each other. The semiconductor device structure includes a first conductive via structure and a second conductive via structure over the semiconductor substrate and adjacent to each other. A first distance between the first conductive plug and the second conductive plug is less than a second distance between the first conductive via structure and the second conductive via structure. A first height of the first conductive plug is greater than a second height of the first conductive via structure.

20 Claims, 21 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more complex. For example, the number of photomasks required continues to increase. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1R-1 is another cross-sectional view of the semiconductor device structure, in accordance with some embodiments.

FIG. 1R-2 is a top view of the semiconductor device structure, in accordance with some embodiments.

FIG. 2 is a cross-sectional view of a semiconductor device structure, in accordance with some embodiments.

DETAILED DESCRIPTION

Figure 1A:
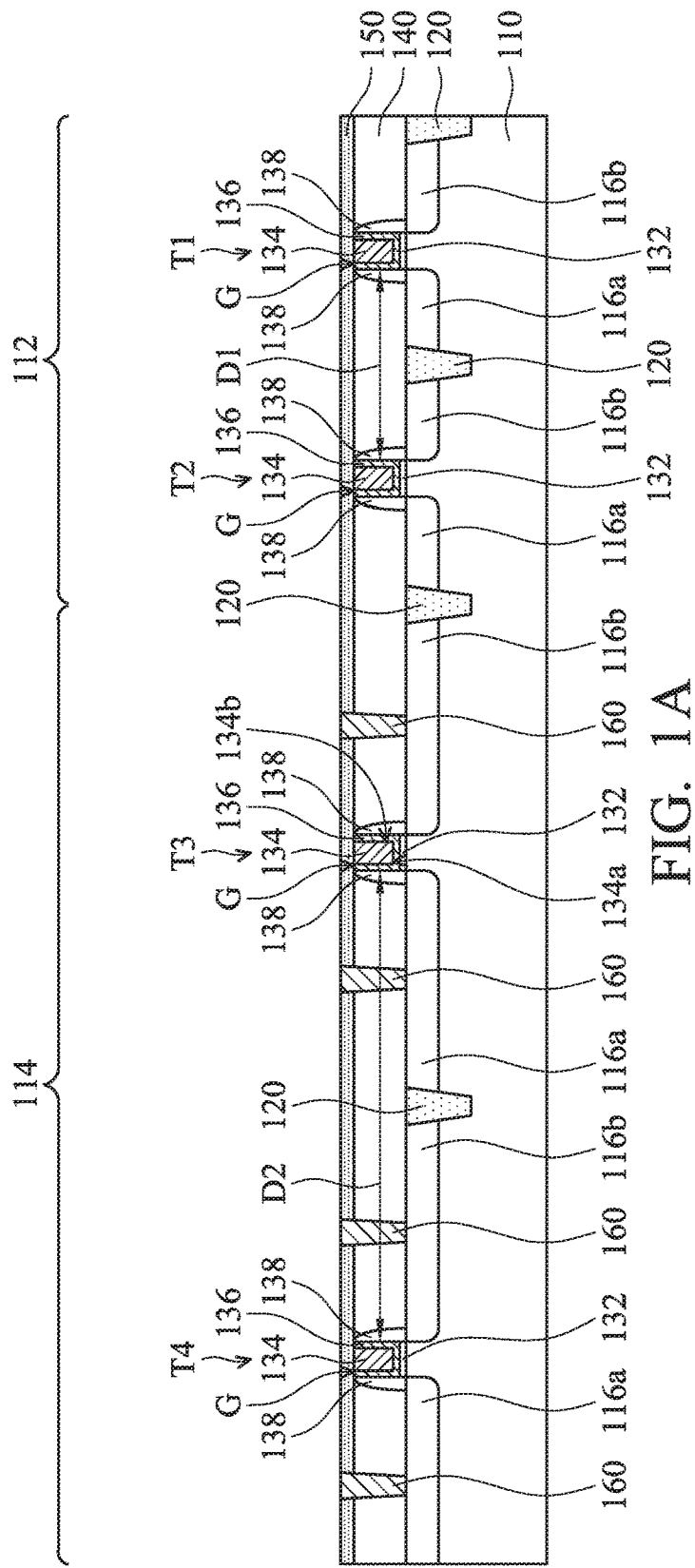
FIGS. 1A-1R are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
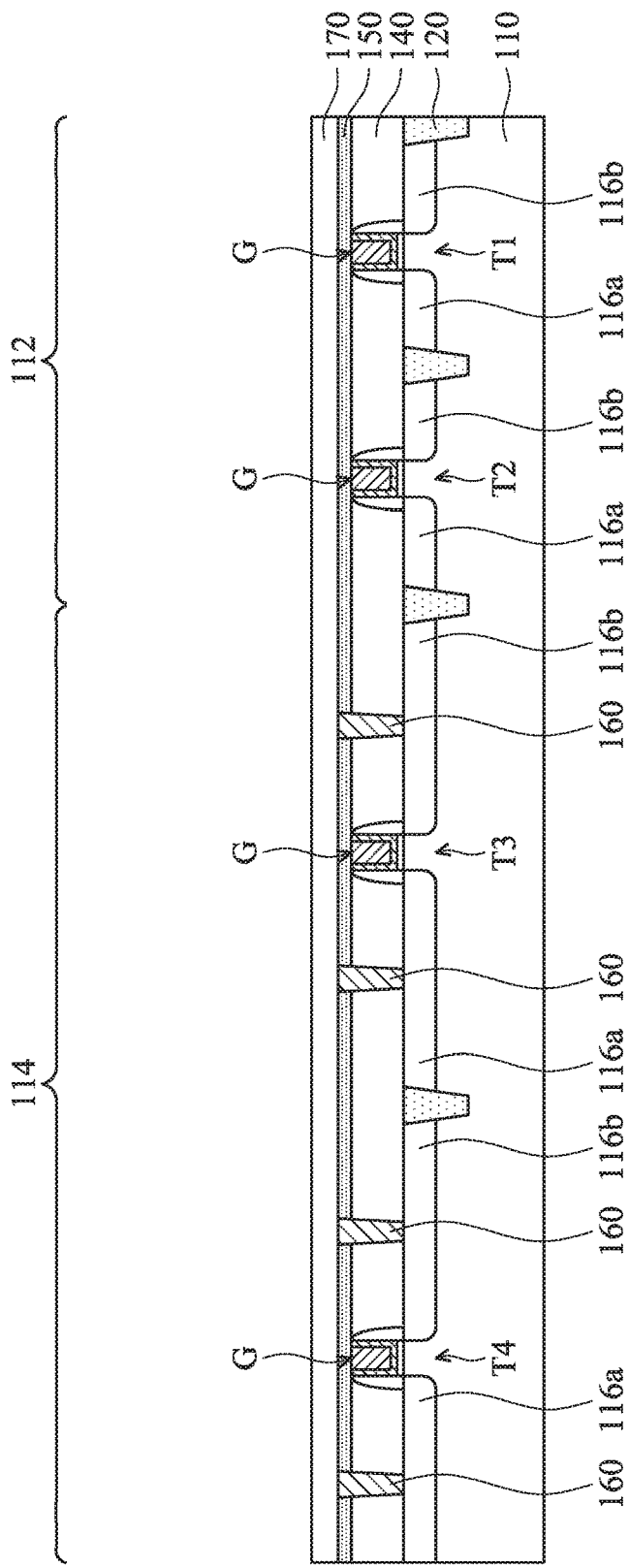
Figure 1C:
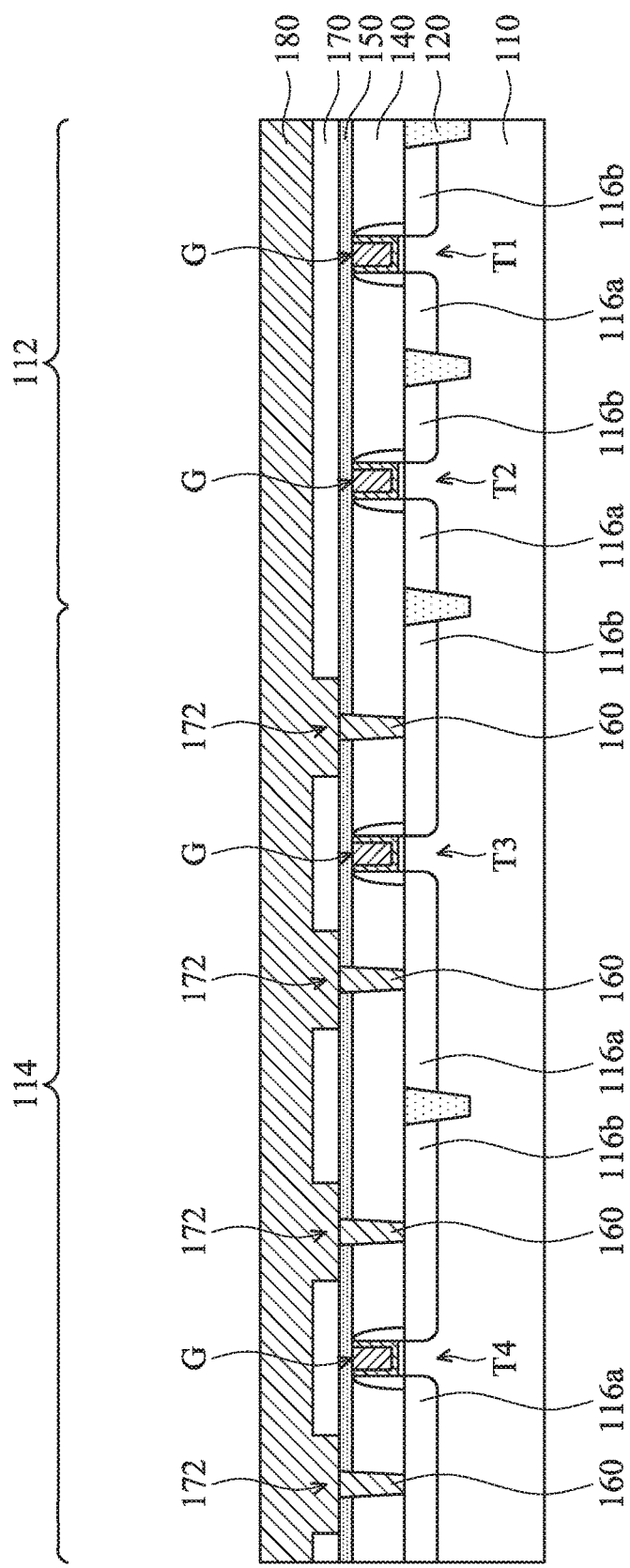
Figure 1D:
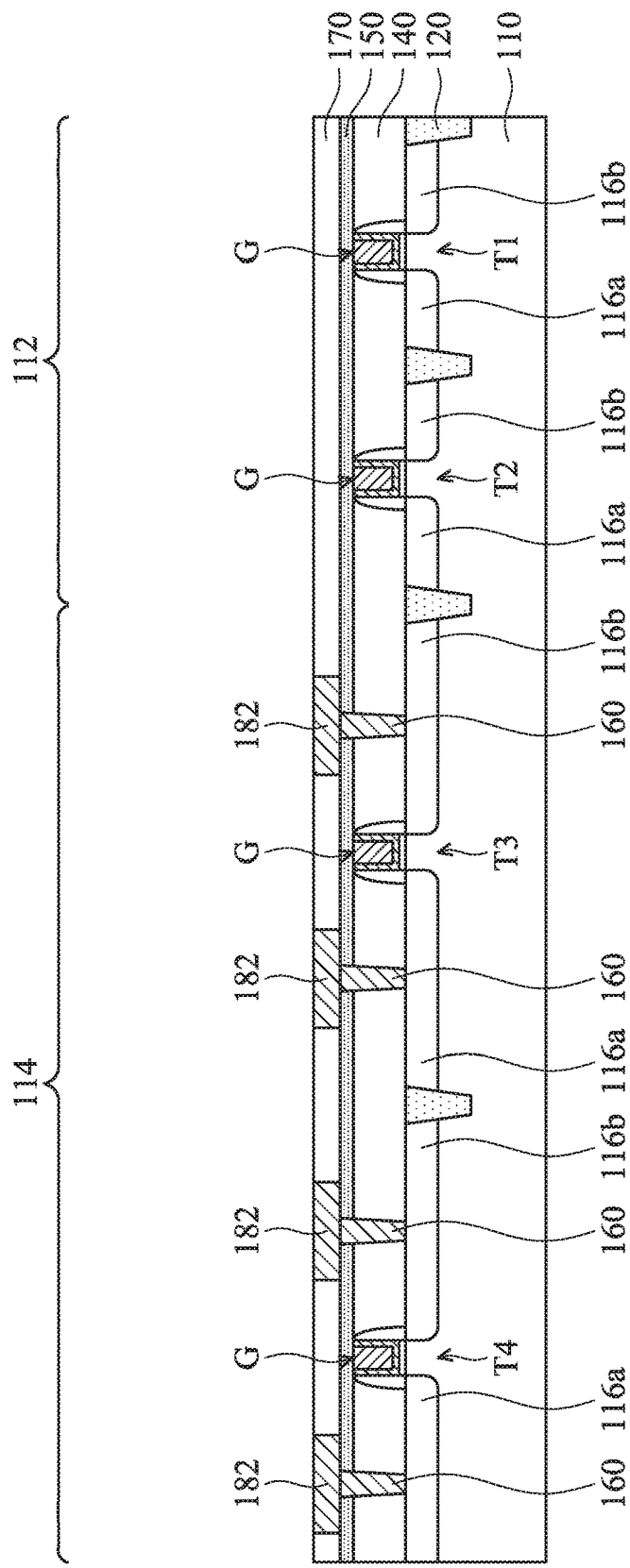
Figure 1E:
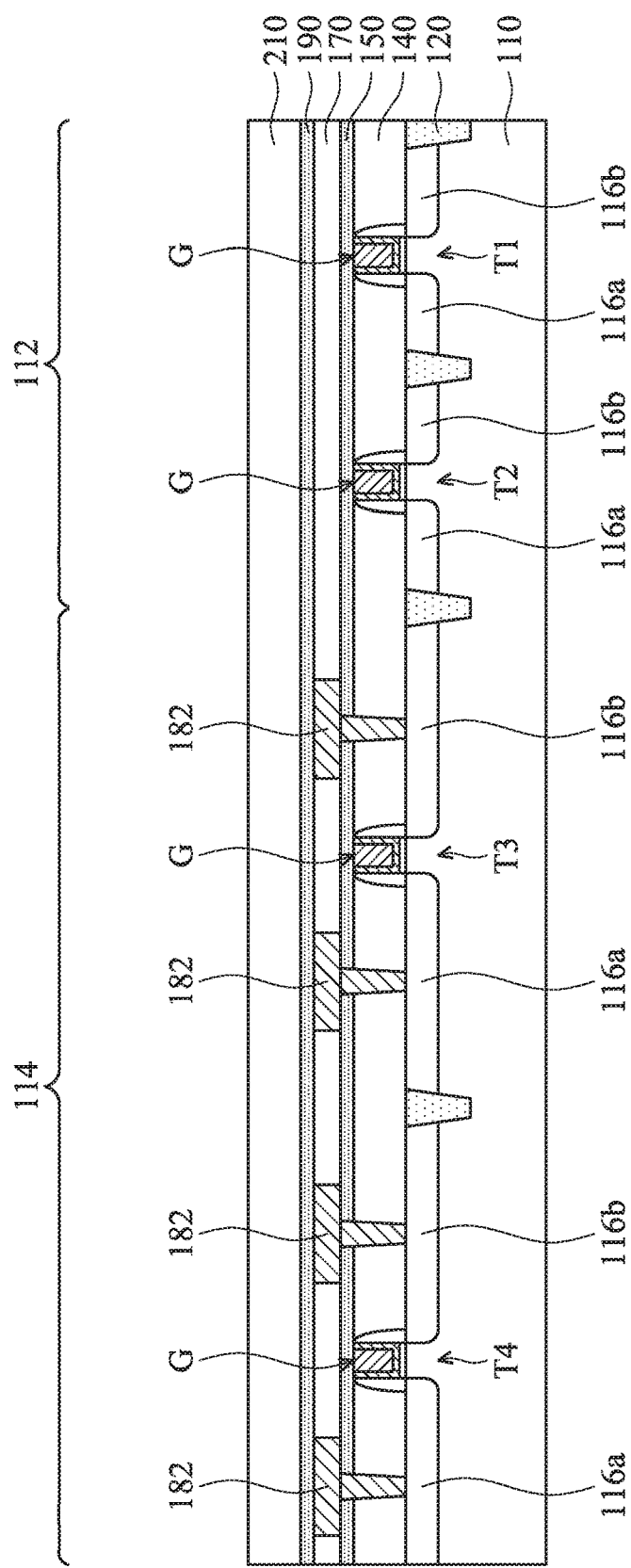
Figure 1F:
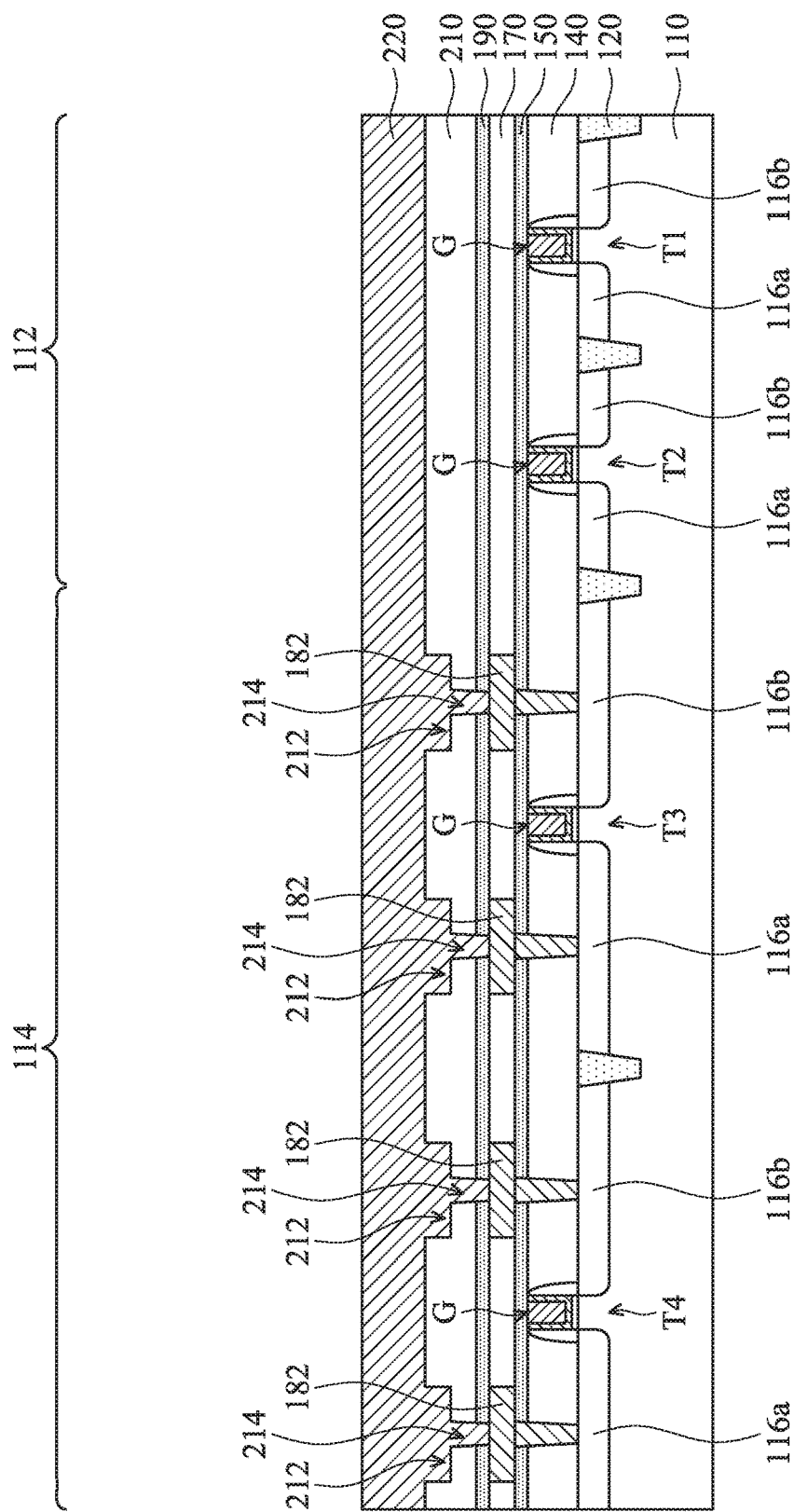
Figure 1G:
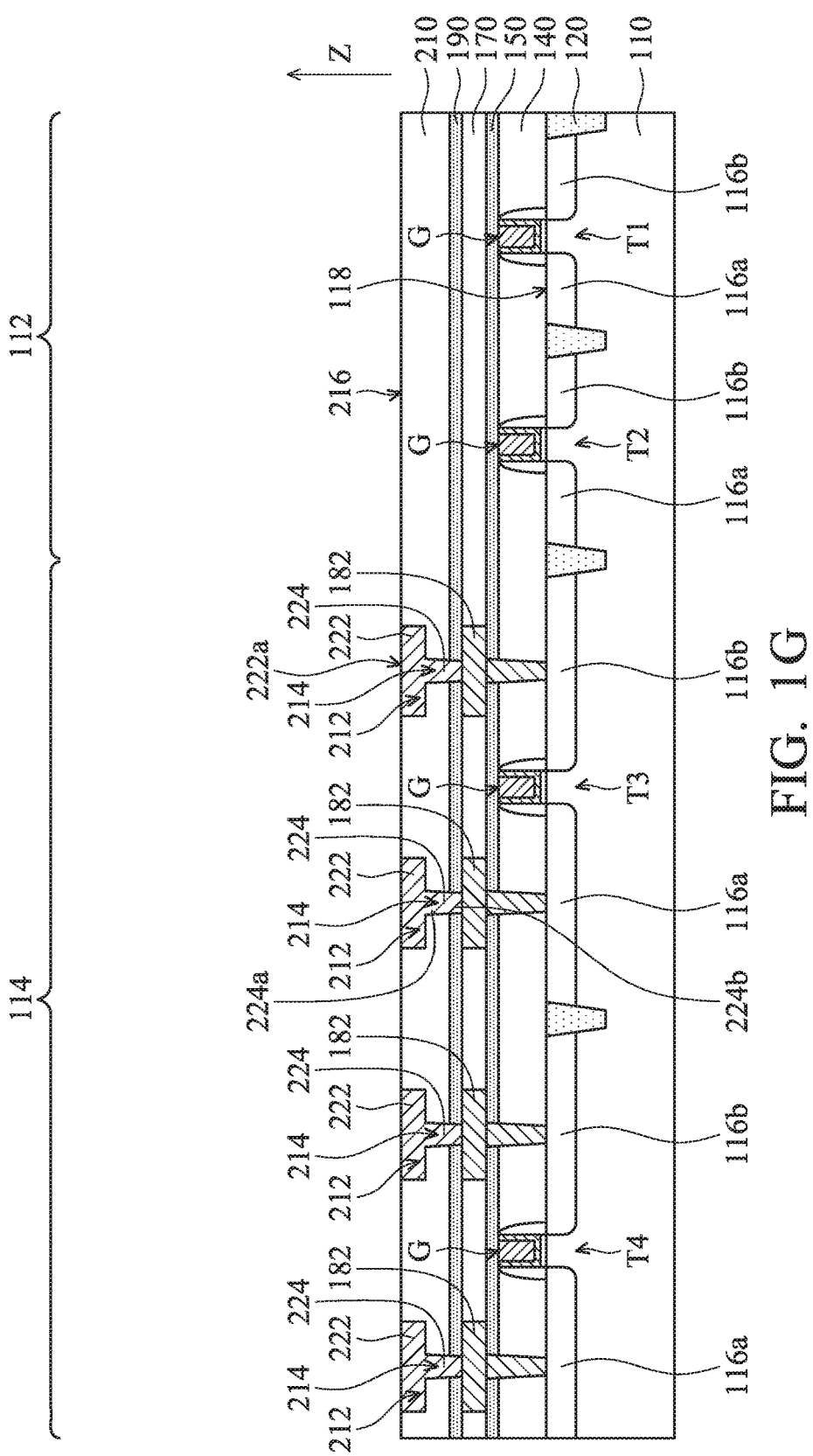
Figure 1H:
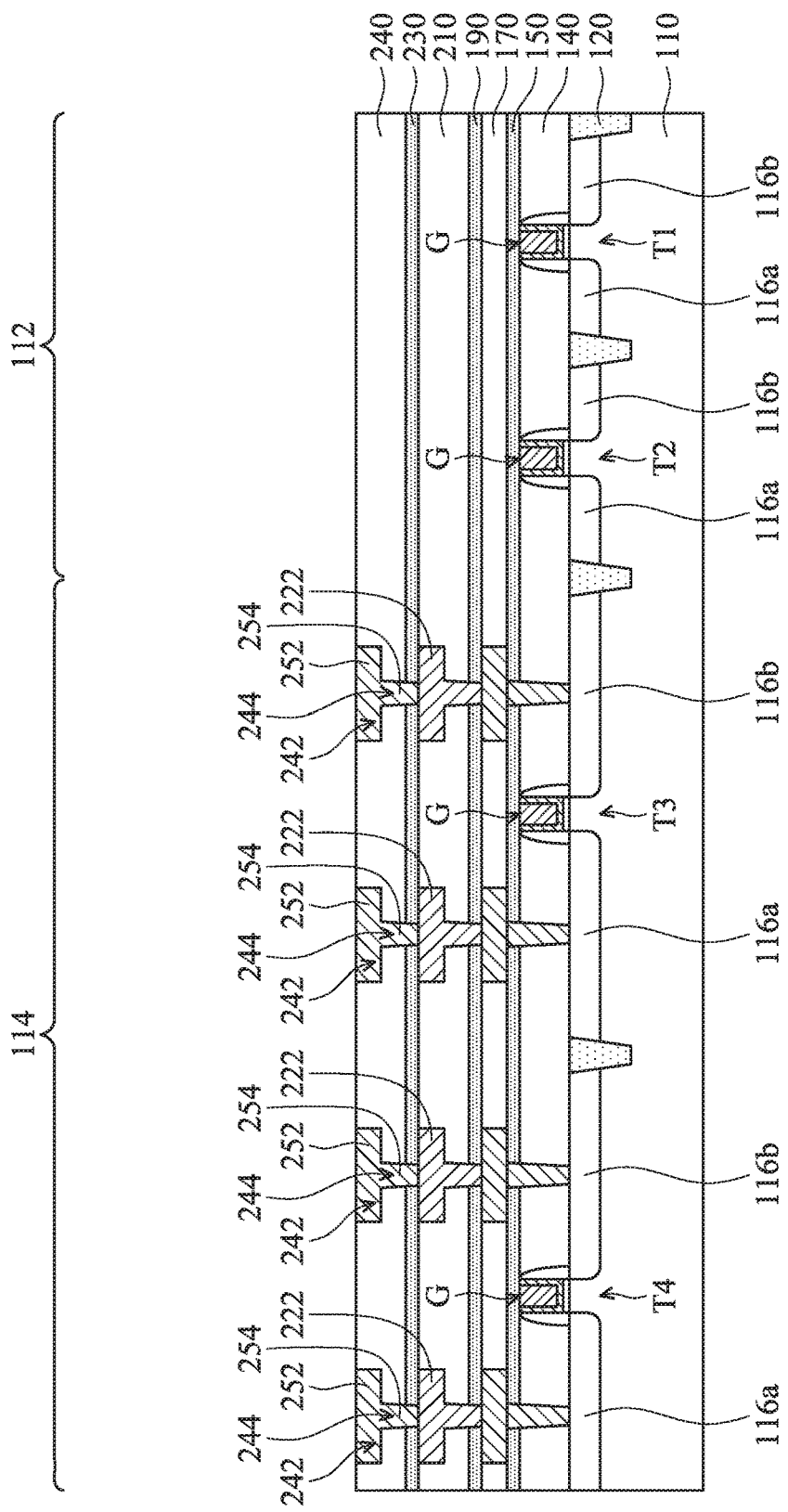
Figure 1I:
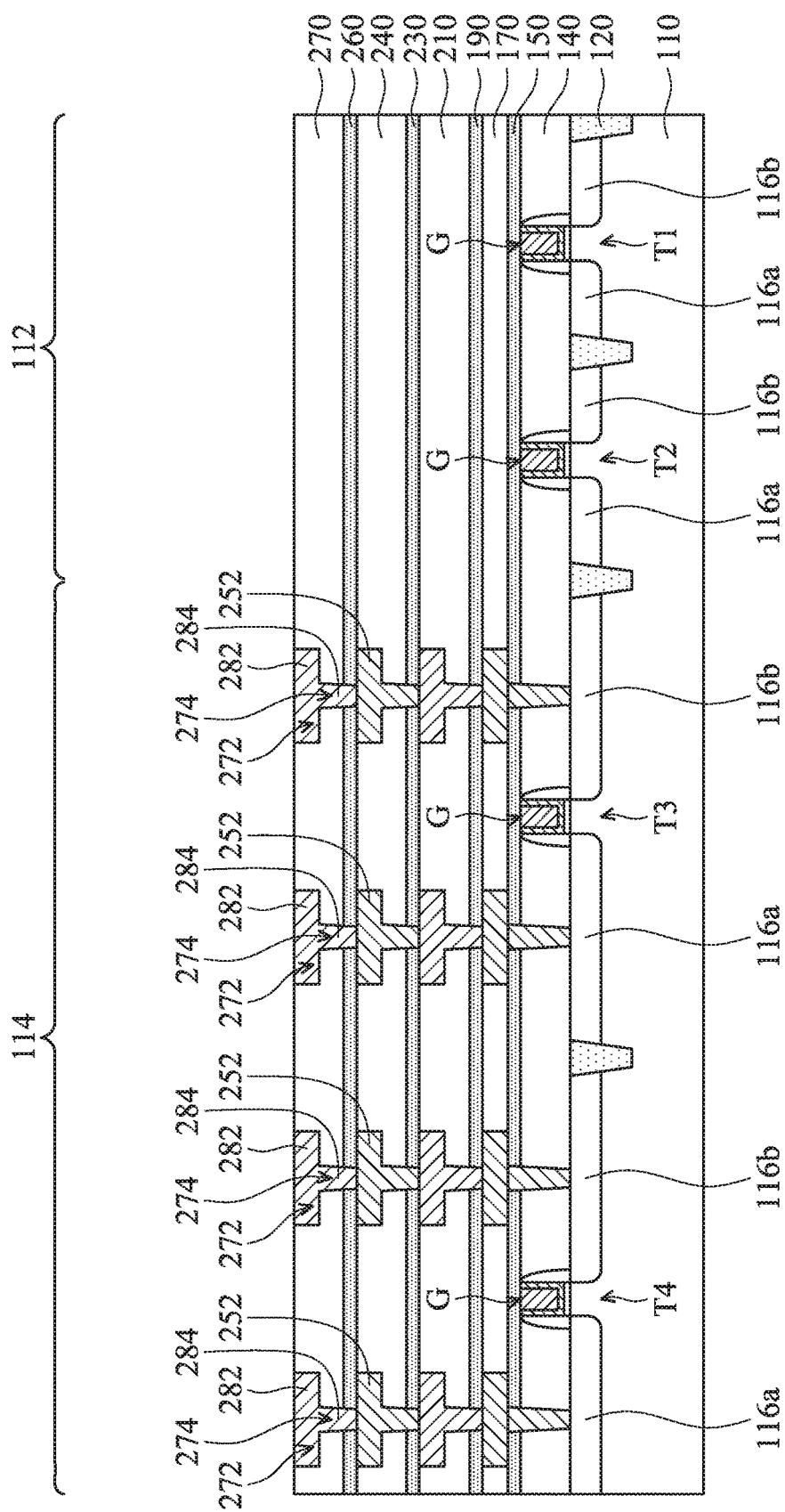
Figure 1J:
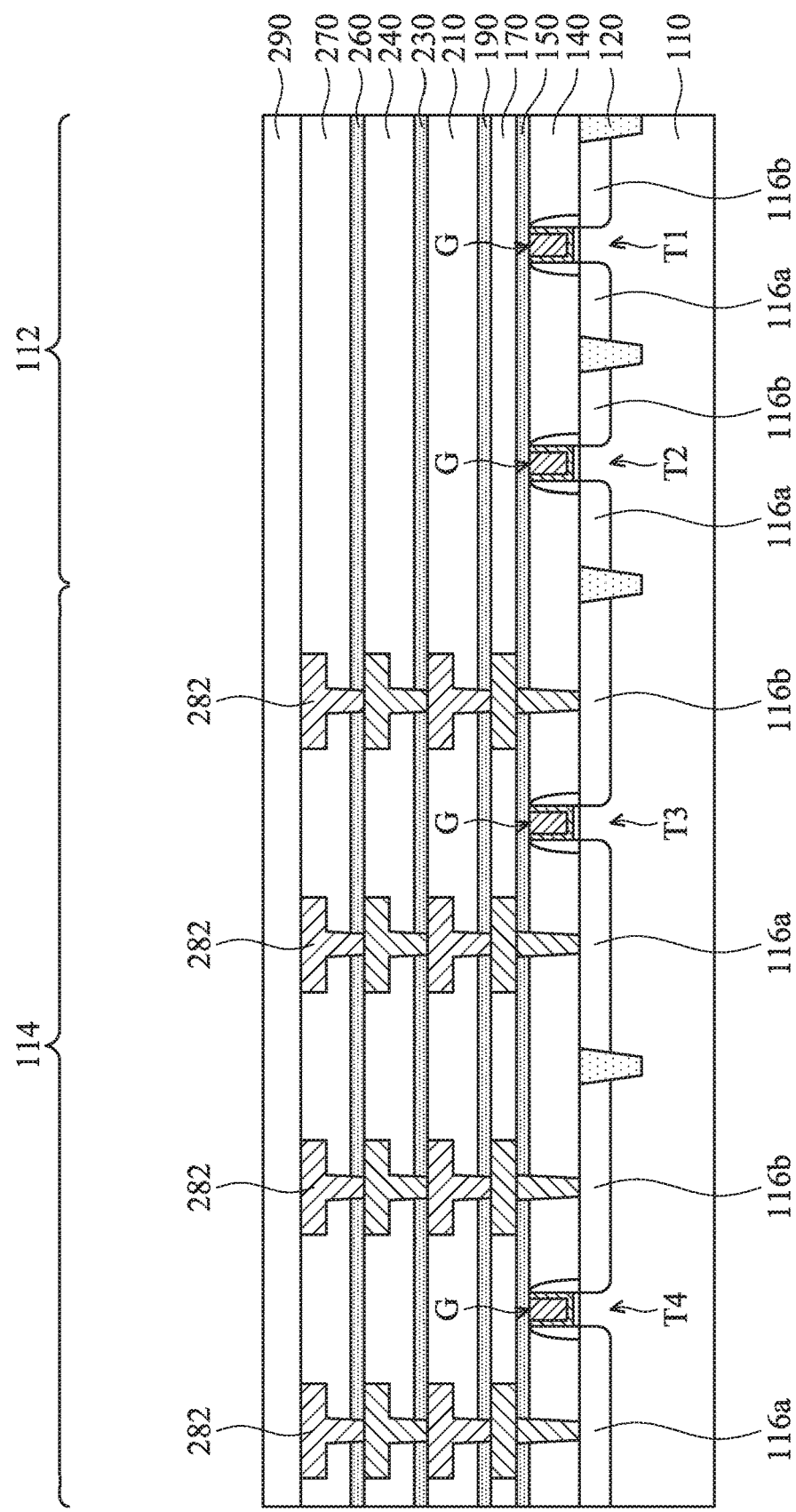
Figure 1K:
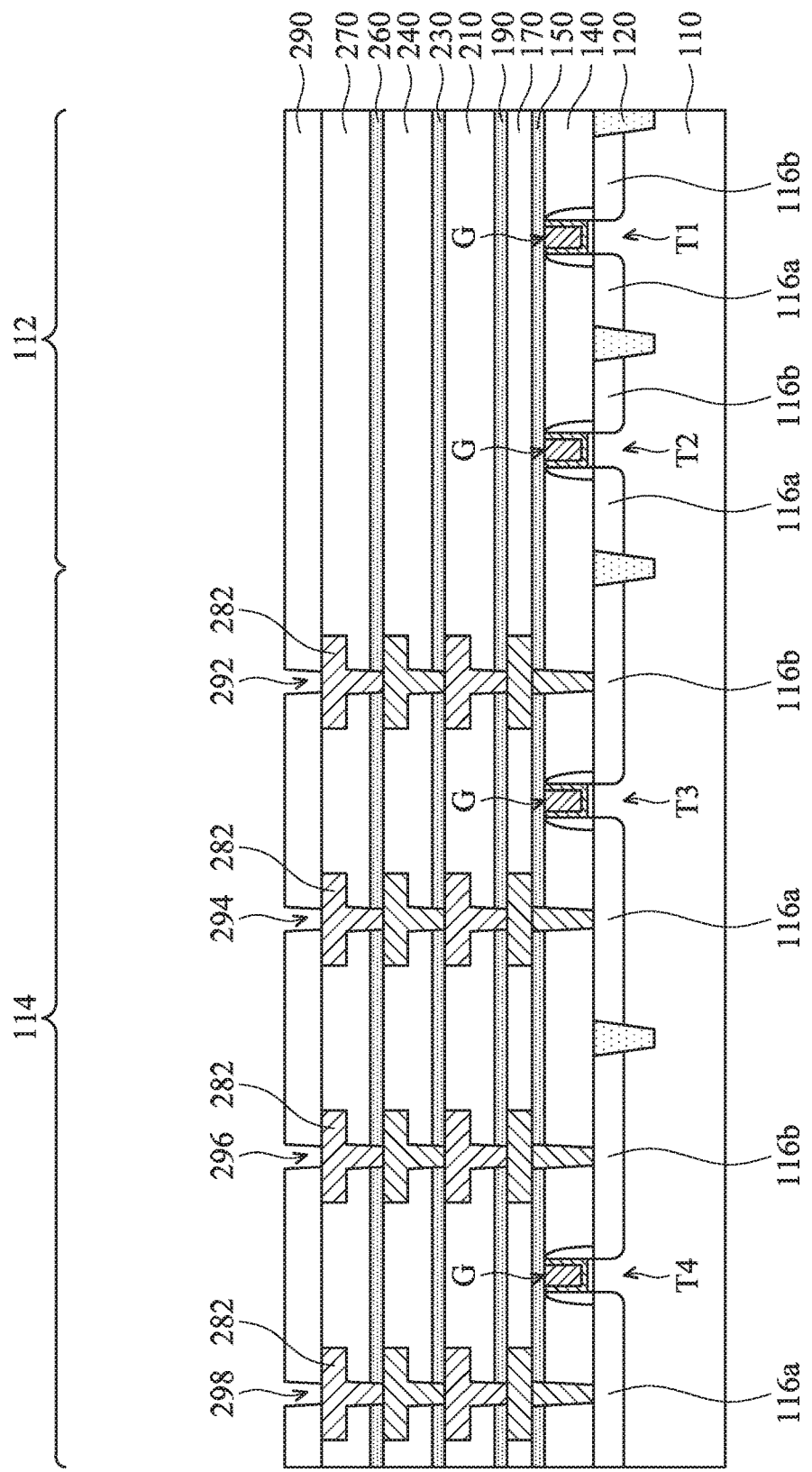
Figure 1L:
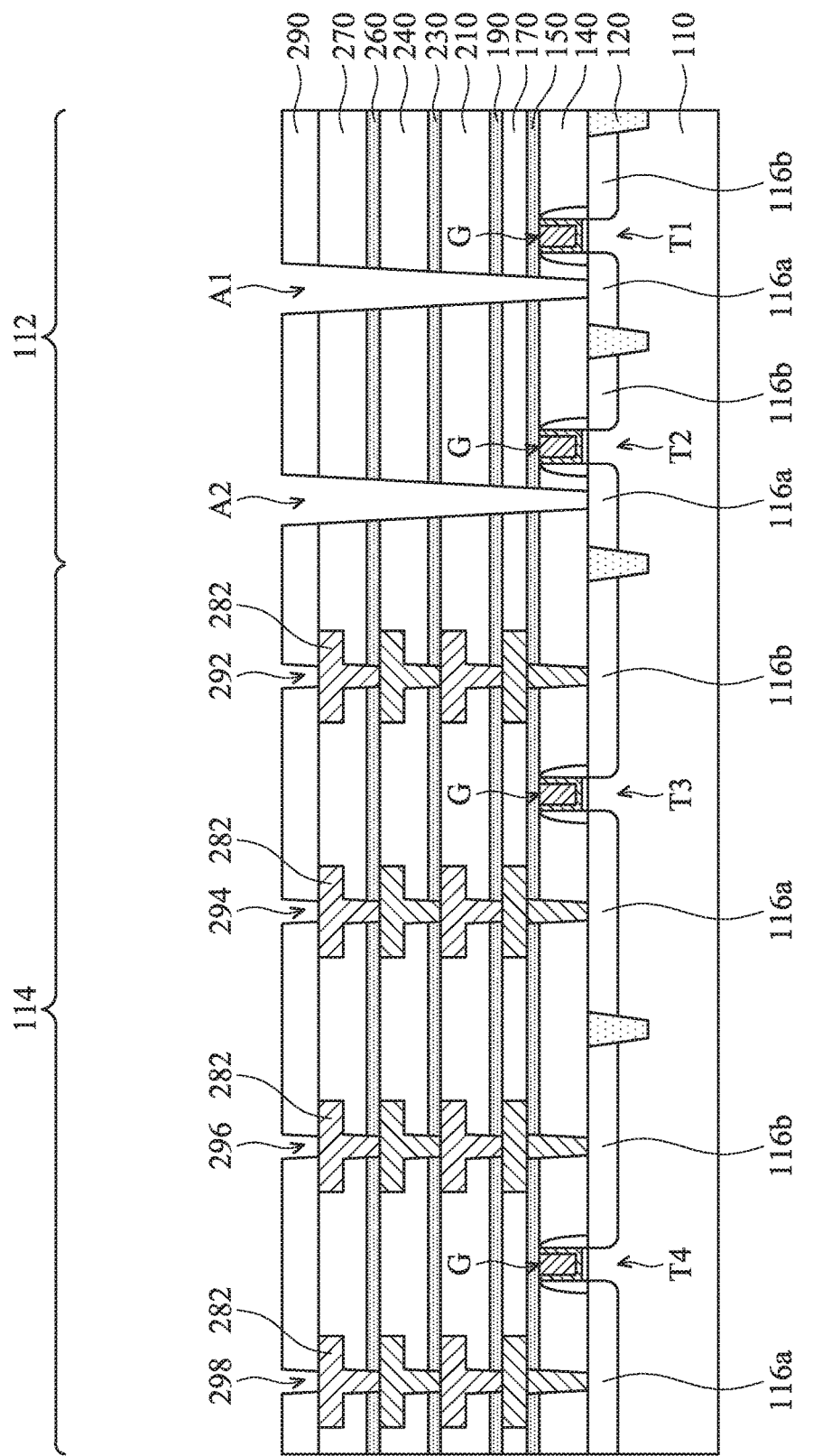
Figure 1M:
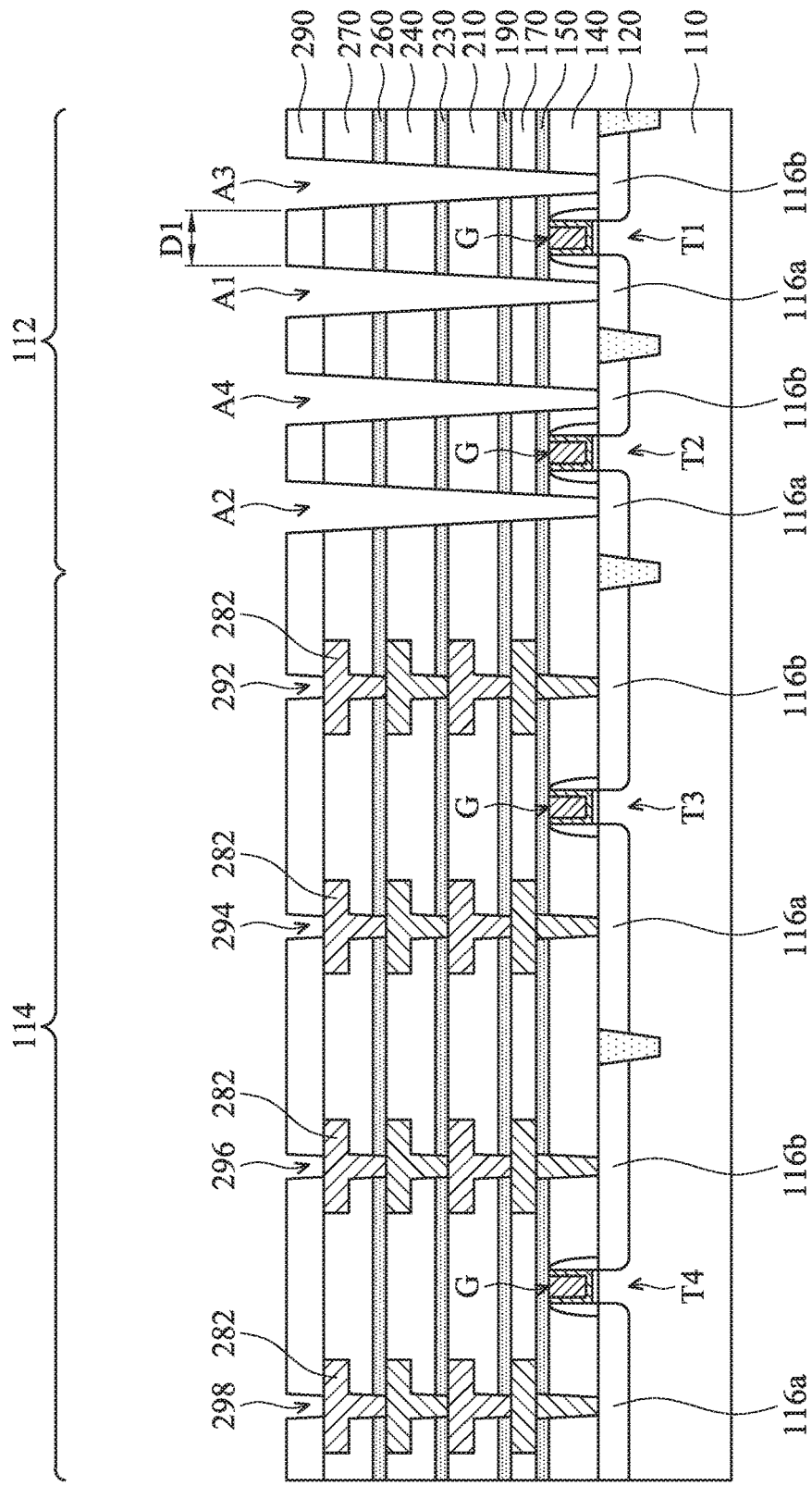
Figure 1N:
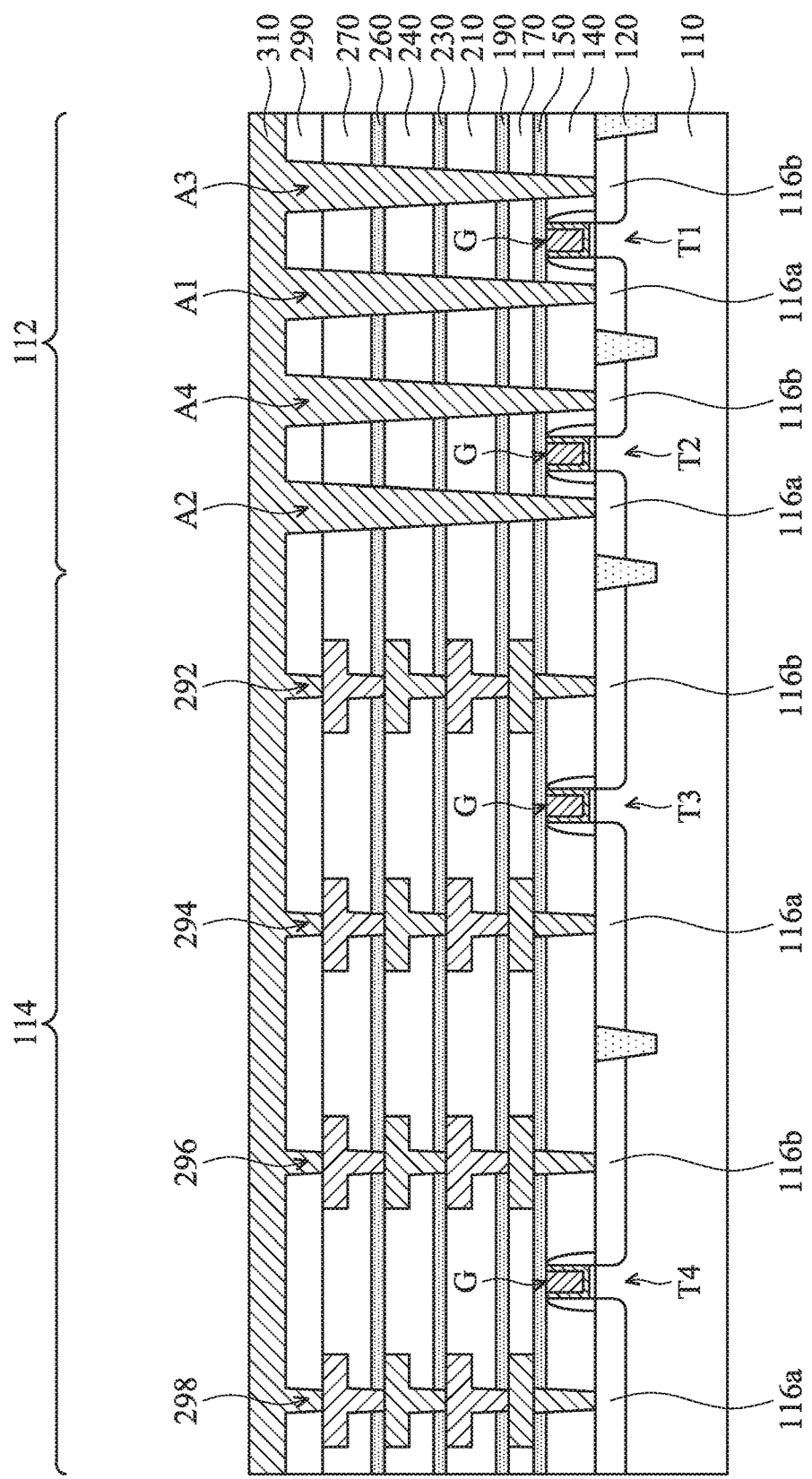
Figure 10:
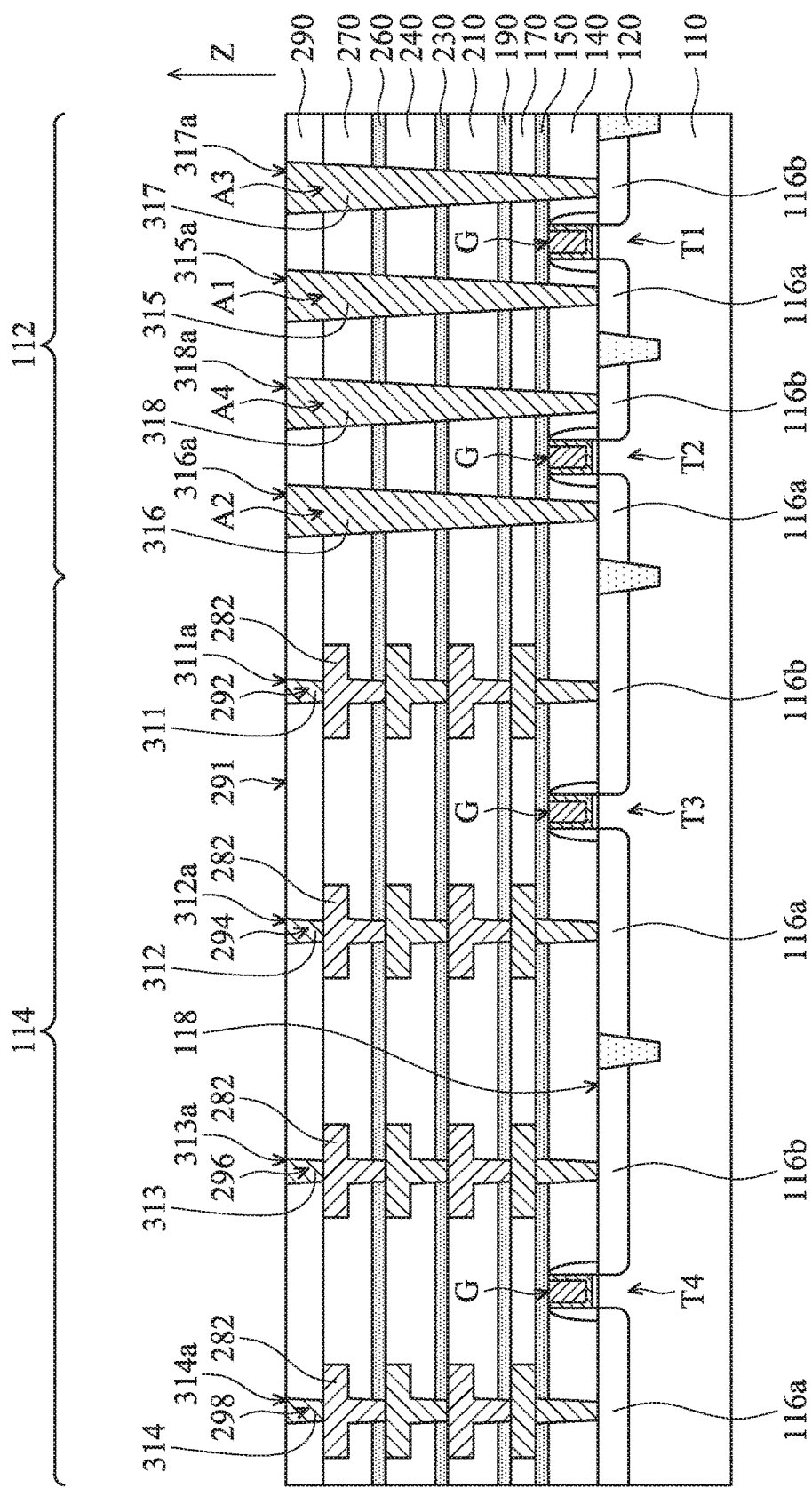
Figure 1P:
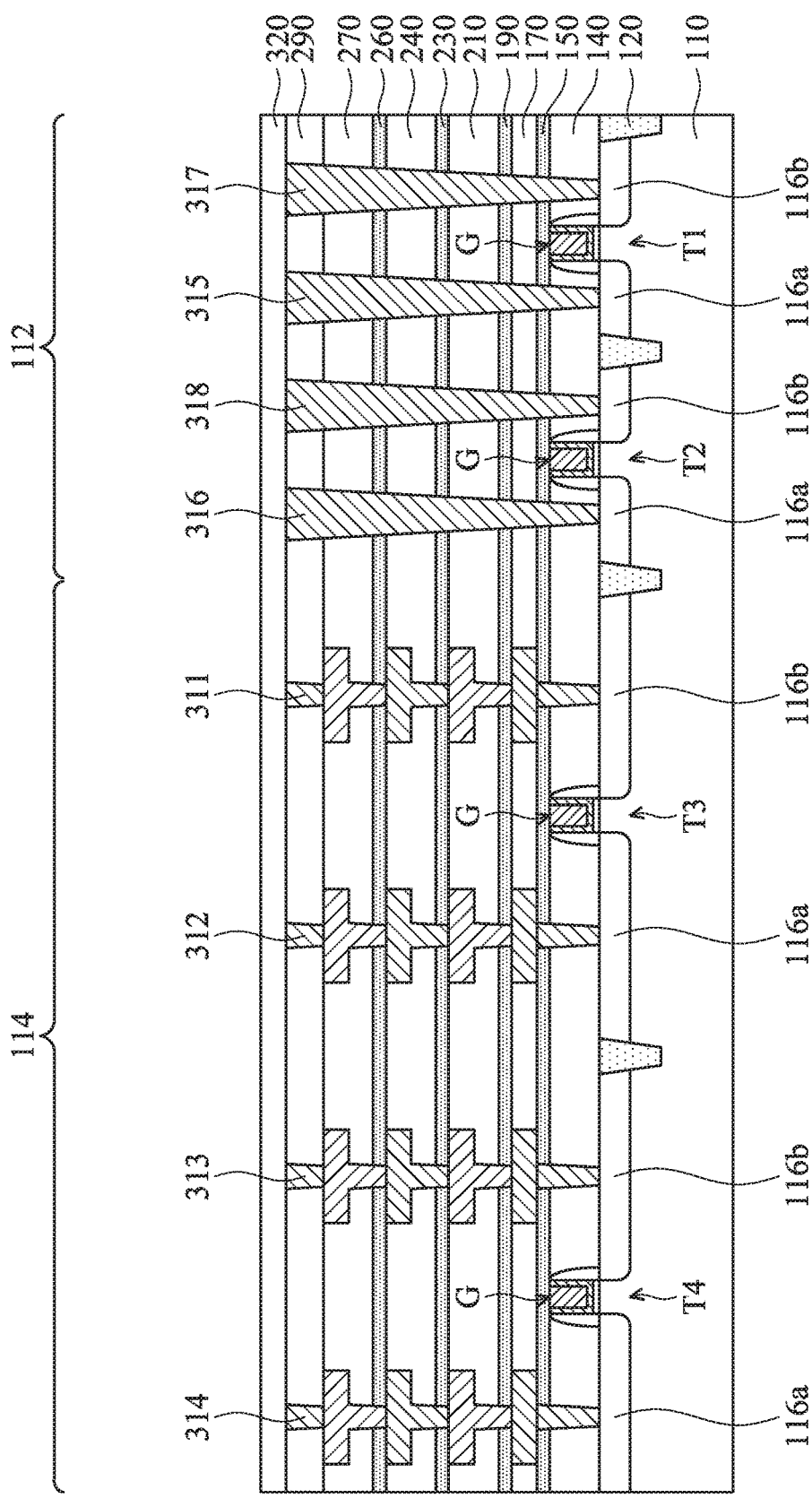
Figure 1Q:
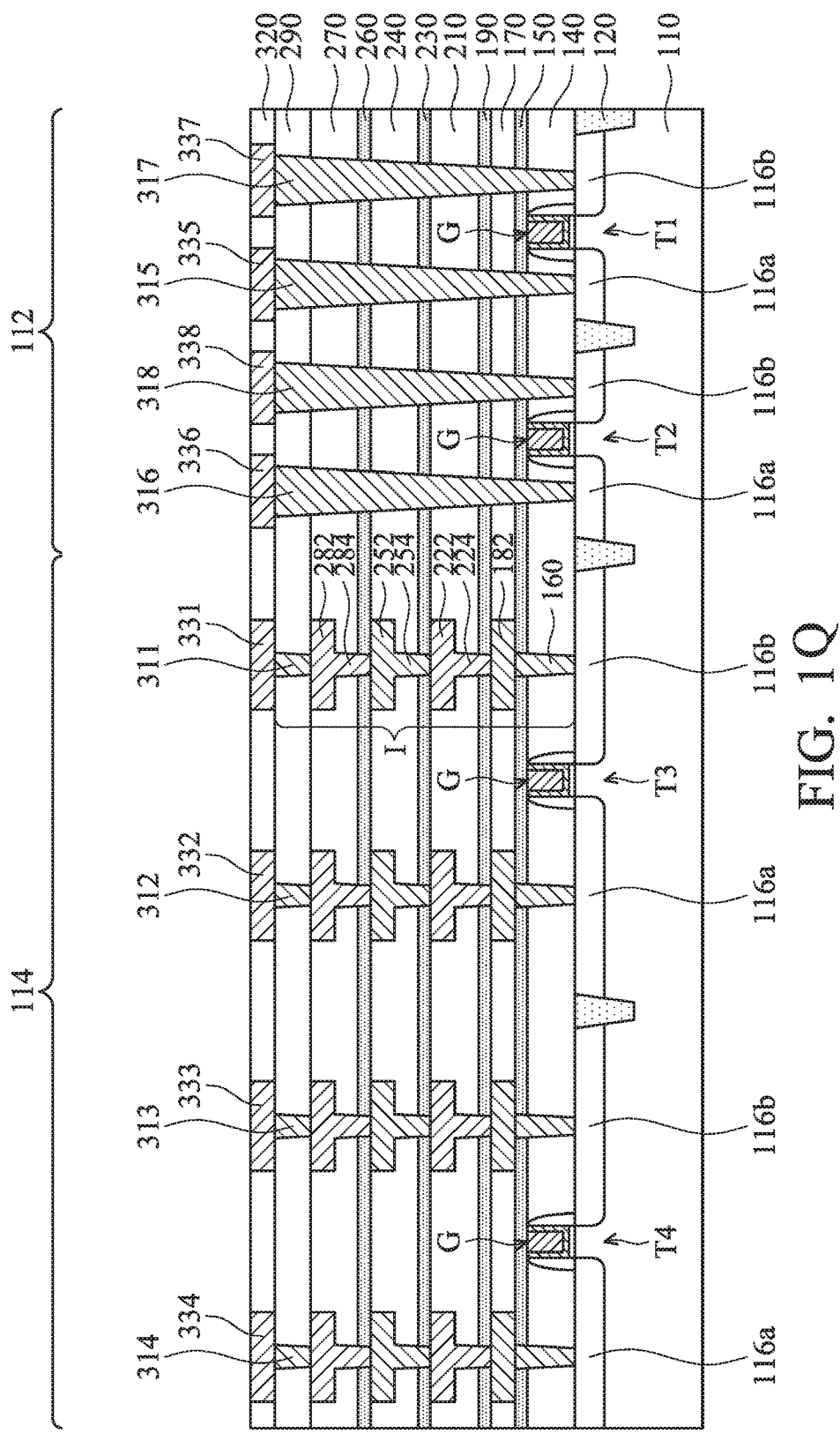
Figure 1R:
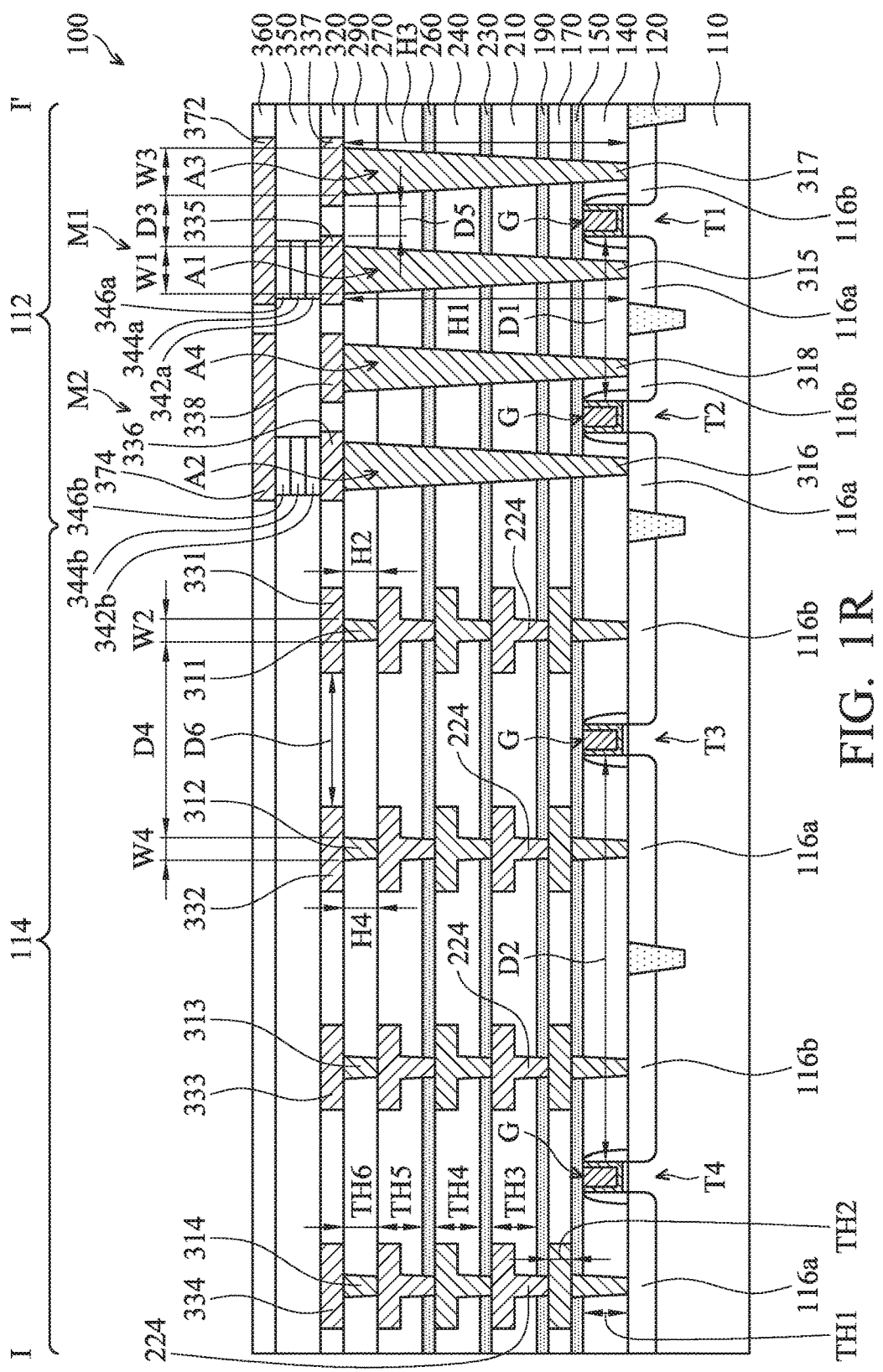

FIGS. 1A-1R are cross-sectional views of various stages of a process for forming a semiconductor device structure 100, in accordance with some embodiments. As shown in FIG. 1A, a semiconductor substrate 110 is provided, in accordance with some embodiments. The semiconductor substrate 110 has a cell region 112 and a logic region 114, in accordance with some embodiments. The density of the devices (e.g. transistors or memory devices) formed in the cell region 112 is greater than the density of the devices formed in the logic region 114, in accordance with some embodiments.

The semiconductor substrate 110 may be a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure.

In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

As shown in FIG. 1A, an isolation structure 120 is formed in the semiconductor substrate 110 to define various active regions in the semiconductor substrate 110, and to electrically isolate neighboring devices (e.g. transistors) from one another, in accordance with some embodiments. The isolation structure 120 includes a dielectric material, such as silicon oxide, silicon nitride, silicon oxynitride, fluoride-doped silicate glass (FSG), a low-K dielectric material, another suitable material, or a combination thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process, etching a trench in the semiconductor substrate 110, and filling the trench with the dielectric material. In some embodiments, the filled trench has a multi-layer structure, such as a thermal oxide liner layer filled with silicon nitride or silicon oxide.

As shown in FIG. 1A, transistors T1, T2, T3, and T4 are formed on and in the semiconductor substrate 110, in accordance with some embodiments. The transistors T1, T2, T3, and T4 are isolated from each other by the isolation structure 120, in accordance with some embodiments. Each of the transistors T1, T2, T3, and T4 includes a gate stack G, a first doped region 116$a$, and a second doped region 116$b$, in accordance with some embodiments.

The transistors T1 and T2 are located in the cell region 112, in accordance with some embodiments. The transistors T3 and T4 are located in the logic region 114, in accordance with some embodiments. Since the density of the devices formed in the cell region 112 is greater than the density of the devices formed in the logic region 114, the distance D1 between the gate stacks G of the transistors T1 and T2 is less than the distance D2 between the gate stacks G of the transistors T3 and T4, in accordance with some embodiments. The distance D1 ranges from about 30 nm to 50 nm, in accordance with some embodiments. The distance D2 ranges from about 100 nm to 200 nm, in accordance with some embodiments.

The gate stack G is formed over the semiconductor substrate 110, in accordance with some embodiments. The first doped region 116a and the second doped region 116b are in the semiconductor substrate 110 and positioned at two opposite sides of the corresponding gate stack G, in accordance with some embodiments. The gate stack G includes a gate dielectric layer 132 and a gate electrode 134, in accordance with some embodiments. The gate electrode 134 is over the gate dielectric layer 132, in accordance with some embodiments.

The gate dielectric layer 132 is made of silicon oxide, silicon oxynitride, a combination thereof, or another suitable material. In some embodiments, the gate dielectric layer 132 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), or a combination thereof, in accordance with some embodiments. The gate dielectric layer 132 is formed using a chemical vapor deposition process or another suitable process.

The gate electrode 134 includes a suitable metal material, such as aluminum, tungsten, gold, platinum, cobalt, other suitable metal, alloy thereof, or a combination thereof, in accordance with some embodiments. In some other embodiments, the gate electrode 134 includes polysilicon. The gate electrode 134 is deposited by using a PVD process, a CVD process, a plating process, the like, or a combination thereof, in accordance with some embodiments.

In some embodiments, the gate stack G further includes a work function metal layer 136, in accordance with some embodiments. The work function metal layer 136 is between the gate electrode 134 and the gate dielectric layer 132, in accordance with some embodiments. The work function metal layer 136 covers a bottom surface 134a and sidewalls 134b of the gate electrode 134, in accordance with some embodiments. The work function metal layer 136 provides a desired work function for transistors to enhance device performance including improved threshold voltage, in accordance with some embodiments.

In the embodiments of forming an NMOS transistor, the work function metal layer 136 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a PMOS transistor, the work function metal layer 136 can be a p-type metal capable of providing a work function value suitable for the device, such as equal to or greater than about 4.8 eV. The p-type metal includes metal, metal carbide, metal nitride, another suitable material, or a combination thereof, in accordance with some embodiments. For example, the p-type metal is made of titanium, titanium nitride, another suitable material, or a combination thereof.

The work function metal layer 136 includes hafnium, zirconium, titanium, tantalum, aluminum, metal carbides, aluminides, ruthenium or a combination thereof, in accordance with some embodiments. The metal carbides include hafnium carbide or zirconium carbide, in accordance with some embodiments. The work function metal layer 136 is formed by using a PVD process, CVD process, ALD process, plating process, another suitable method, or a combination thereof, in accordance with some embodiments.

The first doped region 116a and the second doped region 116b include heavily doped source regions and heavily doped drain regions, in accordance with some embodiments. The first doped region 116a and the second doped region 116b are doped with IIIA-group elements or VA-group elements, in accordance with some embodiments. The first doped region 116a and the second doped region 116b are formed using an ion implantation process, in accordance with some embodiments.

As shown in FIG. 1A, each of the transistors T1, T2, T3, and T4 further includes a spacer layer 138, in accordance with some embodiments. The spacer layer 138 surrounds the corresponding gate stack G, in accordance with some embodiments. The spacer layer 138 includes a dielectric material, such as silicon nitride, silicon oxynitride, or a combination thereof, in accordance with some embodiments.

As shown in FIG. 1A, a dielectric layer 140 is formed over the semiconductor substrate 110, in accordance with some embodiments. The dielectric layer 140 surrounds the gate stacks G of the transistors T1, T2, T3, and T4, in accordance with some embodiments. The dielectric layer 140 includes an insulating material, in accordance with some embodiments.

The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 140 is formed using a CVD process, a HDPCVD process, a spin-on process, a sputtering process, or a combination thereof, in accordance with some embodiments.

As shown in FIG. 1A, an etch stop layer 150 is deposited over the dielectric layer 140 and the gate stacks G of the transistors T1, T2, T3, and T4, in accordance with some embodiments. In some embodiments, the etch stop layer 150 is in direct contact with the gate stacks G. The etch stop layer 150 is made of silicon nitride or another suitable material, in accordance with some embodiments.

As shown in FIG. 1A, conductive contact structures 160 are formed in the dielectric layer 140 and the etch stop layer 150, in accordance with some embodiments. The conductive contact structures 160 individually pass through the dielectric layer 140 and the etch stop layer 150, in accordance with some embodiments. The conductive contact structures 160 are electrically connected to the first doped regions 116a and the second doped regions 116*b* thereunder respectively, in accordance with some embodiments. The conductive contact structures 160 includes tungsten or another suitable conductive material.

As shown in FIG. 1B, a dielectric layer 170 is formed over the etch stop layer 150 and the conductive contact structures 160, in accordance with some embodiments. The dielectric layer 170 includes an insulating material, in accordance with some embodiments. The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 170 is formed using a CVD process, a HDPCVD process, a spin-on process, a sputtering process, or a combination thereof, in accordance with some embodiments.

As shown in FIG. 1C, portions of the dielectric layer 170 are removed, in accordance with some embodiments. After the removal process, trenches 172 are formed in the dielectric layer 170, in accordance with some embodiments. The trenches 172 expose the respective conductive contact structures 160 and expose portions of the etch stop layer 150 adjacent to the conductive contact structures 160, in accordance with some embodiments. The removal process includes a photolithography process and an etching process, in accordance with some embodiments.

As shown in FIG. 1C, a conductive material layer 180 is formed over the dielectric layer 170, in accordance with some embodiments. The conductive material layer 180 is filled into the trenches 172, in accordance with some embodiments. The conductive material layer 180 includes copper, aluminum, tungsten, or another suitable conductive material. The conductive material layer 180 is formed using a physical vapor deposition process or another suitable process.

As shown in FIG. 1D, the conductive material layer 180 outside of the trenches 172 is removed, in accordance with some embodiments. The removal process includes a chemical mechanical polishing process, in accordance with some embodiments. The conductive material layer 180 remaining in the trenches 172 forms conductive lines 182, in accordance with some embodiments. The conductive lines 182 are electrically connected to the respective conductive contact structures 160 thereunder, in accordance with some embodiments.

As shown in FIG. 1E, an etch stop layer 190 is deposited over the dielectric layer 170 and the conductive lines 182, in accordance with some embodiments. In some embodiments, the etch stop layer 190 is in direct contact with the conductive lines 182. The etch stop layer 190 is made of silicon nitride or another suitable material, in accordance with some embodiments.

As shown in FIG. 1E, a dielectric layer 210 is formed over the etch stop layer 190, in accordance with some embodiments. The dielectric layer 210 includes an insulating material, in accordance with some embodiments. The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 210 is formed using a CVD process, a HDPCVD process, a spin-on process, a sputtering process, or a combination thereof, in accordance with some embodiments.

As shown in FIG. 1F, portions of the dielectric layer 210 and the etch stop layer 190 over the conductive lines 182 are removed, in accordance with some embodiments. The removal process forms trenches 212 in the dielectric layer 210 over the conductive lines 182, in accordance with some embodiments. The removal process forms vias 214 in the dielectric layer 210 and the etch stop layer 190 and under the trenches 212, in accordance with some embodiments. The vias 214 communicate with the respective trenches 212 thereabove, in accordance with some embodiments. The vias 214 pass through the dielectric layer 210 and the etch stop layer 190, in accordance with some embodiments.

As shown in FIG. 1F, a conductive material layer 220 is formed over the dielectric layer 210, in accordance with some embodiments. The conductive material layer 220 is filled into the trenches 212 and the vias 214, in accordance with some embodiments. The conductive material layer 220 includes copper, aluminum, tungsten, or another suitable conductive material. The conductive material layer 220 is formed using a physical vapor deposition process or another suitable process.

As shown in FIG. 1G, the conductive material layer 220 outside of the trenches 212 and the vias 214 is removed, in accordance with some embodiments. The removal process includes a chemical mechanical polishing process, in accordance with some embodiments. The conductive material layer 220 remaining in the trenches 212 forms conductive lines 222, in accordance with some embodiments. The conductive material layer 220 remaining in the vias 214 forms conductive via structures 224, in accordance with some embodiments.

The conductive via structures 224 are connected to the respective conductive lines 222 thereabove, in accordance with some embodiments. There is no interface between the conductive via structure 224 and the conductive line 222 thereabove, in accordance with some embodiments. In some embodiments, top surfaces 222*a* of the conductive lines 222 are aligned with a top surface 216 of the dielectric layer 210.

The conductive via structures 224 extend in a direction Z perpendicular to a top surface 118 of the semiconductor substrate 110, in accordance with some embodiments. The conductive via structures 224 are in a pillar shape, such as a trapezoid pillar shape, in accordance with some embodiments. The conductive via structure 224 has a first end portion 224*a* and a second end portion 224*b*, in accordance with some embodiments.

The second end portion 224*b* is between the first end portion 224*a* and the semiconductor substrate 110, in accordance with some embodiments. The first end portion 224*a* is wider than the second end portion 224*b*, in accordance with some embodiments. The conductive lines 222 extend in a plane parallel to the top surface 118, in accordance with some embodiments.

As shown in FIG. 1H, the steps of FIGS. 1E-1G are performed to form an etch stop layer 230, a dielectric layer 240, conductive lines 252, and conductive via structures 254 over the dielectric layer 210 and the conductive lines 222, in accordance with some embodiments. The etch stop layer 230 is formed over the dielectric layer 210 and the conductive lines 222, in accordance with some embodiments. The dielectric layer 240 is formed over the etch stop layer 230, in accordance with some embodiments.

The conductive lines 252 are filled in trenches 242 of the dielectric layer 240, in accordance with some embodiments. The conductive via structures 254 are filled in vias 244 passing through the dielectric layer 240 and the etch stop layer 230, in accordance with some embodiments. The conductive via structures 254 are connected to the respective conductive lines 252 thereon, in accordance with some embodiments.

As shown in FIG. 1I, the steps of FIGS. 1E-1G are performed to form an etch stop layer 260, a dielectric layer 270, conductive lines 282, and conductive via structures 284 over the dielectric layer 240 and the conductive lines 252, in accordance with some embodiments. The etch stop layer 260 is formed over the dielectric layer 240 and the conductive lines 252, in accordance with some embodiments. The dielectric layer 270 is formed over the etch stop layer 260, in accordance with some embodiments.

The conductive lines 282 are filled in trenches 272 of the dielectric layer 270, in accordance with some embodiments. The conductive via structures 284 are filled in vias 274 passing through the dielectric layer 270 and the etch stop layer 260, in accordance with some embodiments. The conductive via structures 284 are connected to the respective conductive lines 282 thereon, in accordance with some embodiments.

As shown in FIG. 1J, a dielectric layer 290 is deposited over the dielectric layer 270 and the conductive lines 282, in accordance with some embodiments. The dielectric layer 290 includes an insulating material, in accordance with some embodiments. The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 290 is formed using a CVD process, a HDPCVD process, a spin-on process, a sputtering process, or a combination thereof, in accordance with some embodiments.

As shown in FIG. 1K, portions of the dielectric layer 290 over the conductive lines 282 are removed, in accordance with some embodiments. The removal process forms vias 292, 294, 296, and 298 passing through the dielectric layer 290, in accordance with some embodiments. The vias 292, 294, 296, and 298 expose portions of the conductive lines 282, in accordance with some embodiments. The removal process includes a photolithography process and an etching process (e.g., a dry etching process), in accordance with some embodiments.

As shown in FIG. 1L, portions of the dielectric layers 140, 170, 210, 240, 270, and 290 and the etch stop layers 150, 190, 230, and 260 are removed, in accordance with some embodiments. The removal process forms through holes A1 and A2 passing through the dielectric layers 140, 170, 210, 240, 270, and 290 and the etch stop layers 150, 190, 230, and 260, in accordance with some embodiments. The through holes A1 and A2 expose the first doped regions 116a of the transistors T1 and T2, respectively, in accordance with some embodiments.

As shown in FIG. 1M, portions of the dielectric layers 140, 170, 210, 240, 270, and 290 and the etch stop layers 150, 190, 230, and 260 are removed, in accordance with some embodiments. The removal process forms through holes A3 and A4 passing through the dielectric layers 140, 170, 210, 240, 270, and 290 and the etch stop layers 150, 190, 230, and 260, in accordance with some embodiments. The through holes A3 and A4 expose the second doped regions 116b of the transistors T1 and T2, respectively, in accordance with some embodiments.

Since the distance D1 between the through holes A1 and A3 (or the through holes A2 and A4) is small, the through holes A1, A2, A3, and A4 are formed using a two-photolithography, two-etch (2P2E) process (i.e., the process of FIGS. 1L and 1M), in accordance with some embodiments. If the distance D1 is large enough, the through holes A1, A2, A3, and A4 may be formed using a one-photolithography, one-etch (1P1E) process.

As shown in FIG. 1N, a conductive material layer 310 is formed over the dielectric layer 290, in accordance with some embodiments. The conductive material layer 310 is filled into the vias 292, 294, 296, and 298 and the through holes A1, A2, A3, and A4, in accordance with some embodiments. The conductive material layer 310 includes copper, aluminum, tungsten, or another suitable conductive material. The conductive material layer 310 is formed using a physical vapor deposition process or another suitable process.

As shown in FIG. 1O, the conductive material layer 310 outside of the vias 292, 294, 296, and 298 and the through holes A1, A2, A3, and A4 is removed, in accordance with some embodiments. The conductive material layer 310 remaining in the vias 292, 294, 296, and 298 forms conductive via structures 311, 312, 313, and 314, respectively, in accordance with some embodiments. The conductive material layer 310 remaining in the through holes A1, A2, A3, and A4 forms conductive plugs 315, 316, 317, and 318, respectively, in accordance with some embodiments.

The conductive via structures 311, 312, 313, and 314 are electrically connected to the respective conductive lines 282 thereunder, in accordance with some embodiments. The conductive plugs 315, 316, 317, and 318 are electrically connected to the respective doped regions 116a and 116b thereunder, in accordance with some embodiments.

The conductive plugs 315, 316, 317, and 318 individually pass through the dielectric layers 140, 170, 210, 240, 270, and 290 and the etch stop layers 150, 190, 230, and 260, in accordance with some embodiments. The conductive via structures 311, 312, 313, and 314 and the conductive plugs 315, 316, 317, and 318 extend in the direction Z perpendicular to the top surface 118 of the semiconductor substrate 110, in accordance with some embodiments.

The entire conductive plug 315 is positioned right over the first doped region 116a of the transistor T1, in accordance with some embodiments. The entire conductive plug 317 is positioned right over the second doped region 116b of the transistor T1, in accordance with some embodiments. The entire conductive plug 316 is positioned right over the first doped region 116a of the transistor T2, in accordance with some embodiments. The entire conductive plug 318 is positioned right over the second doped region 116b of the transistor T2, in accordance with some embodiments.

In some embodiments, top surfaces 311a, 312a, 313a, 314a, 315a, 316a, 317a, 318a, and 291 of the conductive via structure 311, 312, 313, 314, the conductive plugs 315, 316, 317, and 318, and the dielectric layer 290 are aligned with each other. The top surfaces 311a, 312a, 313a, 314a, 315a, 316a, 317a, and 318a face away from the semiconductor substrate 110, in accordance with some embodiments.

As shown in FIG. 1P, a dielectric layer 320 is deposited over the dielectric layer 290, the conductive via structures 311, 312, 313, and 314, and the conductive plugs 315, 316, 317, and 318, in accordance with some embodiments. The dielectric layer 320 includes an insulating material, in accordance with some embodiments. The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 320 is formed using a CVD process, a HDPCVD process, a spin-on process, a sputtering process, or a combination thereof, in accordance with some embodiments.

As shown in FIG. 1Q, conductive lines 331, 332, 333, 334, 335, 336, 337, and 338 are formed in the dielectric layer 320, in accordance with some embodiments. The conductive lines 331, 332, 333, 334, 335, 336, 337, and 338 are over and connected to the conductive via structures 311, 312, 313, and 314, and the conductive plugs 315, 316, 317, and 318, respectively, in accordance with some embodiments.

As shown in FIG. 1R, pinned layers 342a and 342b are formed over the conductive lines 335 and 336, respectively, in accordance with some embodiments. Each of the pinned layers 342a and 342b includes a single layer or a multi-layer structure, in accordance with some embodiments. For example, each of the pinned layers 342a and 342b includes a layer of magnetic materials, such as CoFe, CoFeB, NiFe, Co, Fe, Ni, or the like.

In some embodiment, each of the pinned layers 342a and 342b includes multiple layers, such as a bottom layer and an overlying layer. The bottom layer is formed of a suitable anti-ferromagnetic material, such as PtMn, NiMn, IrMn, FeMn, or the like, in accordance with some embodiments. The overlying layer is formed of magnetic materials, such as CoFe, CoFeB, NiFe, Co, Fe, Ni, or the like, in accordance with some embodiments.

As shown in FIG. 1R, barrier layers 344a and 344b are formed over the pinned layers 342a and 342b, respectively, in accordance with some embodiments. The barrier layers 344a and 344b include a dielectric material, such as MgO, $Al_2O_3$, and/or the like, in accordance with some embodiments. As shown in FIG. 1R, free layers 346a and 346b are formed over the barrier layers 344a and 344b, respectively, in accordance with some embodiments. The free layers 346a and 346b include a magnetic material, such as CoFeB, NiFe, Co, Fe, Ni, FeB, FePt, and/or the like, in accordance with some embodiments.

As shown in FIG. 1R, a dielectric layer 350 is formed over the dielectric layer 320, the conductive lines 331, 332, 333, 334, 335, 336, 337, and 338, in accordance with some embodiments. The pinned layers 342a and 342b, the barrier layers 344a and 344b, and the free layers 346a and 346b are in the dielectric layer 350, in accordance with some embodiments. The dielectric layer 350 includes an insulating material, in accordance with some embodiments. The insulating material includes silicon oxide, such as borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

As shown in FIG. 1R, a dielectric layer 360 is formed over the dielectric layer 350, in accordance with some embodiments. The dielectric layer 360 includes an insulating material, in accordance with some embodiments. As shown in FIG. 1R, conductive lines 372 and 374 are formed in the dielectric layer 360, in accordance with some embodiments. The conductive lines 372 and 374 are electrically connected to the free layers 346a and 346b, respectively, in accordance with some embodiments. The semiconductor device structure 100 is substantially formed, in accordance with some embodiments.

The conductive lines 372 and 374 include a conductive material, in accordance with some embodiments. The conductive line 335, the pinned layer 342a, the barrier layer 344a, the free layer 346a, and the conductive lines 337 and 372 together form a magnetic random access memory (MRAM) M1, in accordance with some embodiments. The conductive line 336, the pinned layer 342b, the barrier layer 344b, the free layer 346b, and the conductive lines 338 and 374 together form a magnetic random access memory (MRAM) M2, in accordance with some embodiments.

Since the density of the devices formed in the cell region 112 is greater than the density of the devices formed in the logic region 114, the minimum distance between adjacent two of the conductive plugs 315, 316, 317, and 318 is less than the minimum distance between adjacent two of the conductive via structures 311, 312, 313, and 314, in accordance with some embodiments. For example, the minimum distance D3 between the conductive plugs 315 and 317 is less than the minimum distance D4 between the conductive via structures 311 and 312. The minimum distance D3 ranges from about 30 nm to 100 nm, in accordance with some embodiments.

Since the density of the devices formed in the cell region 112 is greater than the density of the devices formed in the logic region 114, the photolithography process and the etching process for forming vias and/or trenches in the dielectric layer in the cell region 112 are different from the photolithography process and the etching process for forming vias and/or trenches in the dielectric layer in the logic region 114. That is, the photolithography processes performed in the cell region 112 and the logic region 114 uses different photomasks. Furthermore, if the minimum distance D3 between the conductive plugs 315 and 317 is small, the photolithography process performed in the cell region 112 may need to use more than one photomask to form vias and/or trenches in the dielectric layer in the cell region 112.

Since the embodiments form the through hole A1, A2, A3, or A4 passing through the dielectric layers 140, 170, 210, 240, 270, and 290 and the etch stop layers 150, 190, 230, and 260, there is no need to form vias in the dielectric layers 140, 170, 210, 240, 270, and 290 and the etch stop layers 150, 190, 230, and 260, respectively, by using more than two photomasks.

Therefore, the formation of the through holes A1, A2, A3, and A4 reduces the number of the photomasks required. As a result, the formation of the through holes A1, A2, A3, and A4 reduces the cost of the process for forming the semiconductor device structure 100, in accordance with some embodiments.

Since each of the conductive plugs 315, 316, 317, and 318 is formed using an integral forming process, there is no interface formed in the conductive plugs 315, 316, 317, and 318. Therefore, the resistance of each of the conductive plugs 315, 316, 317, and 318 is less than the resistance of the interconnect structure I formed of the conductive via structures 311, 284, 254, and 224, the conductive contact structure 160, and the conductive lines 182, 222, 252, and 282, as shown in FIG. 1Q. As a result, the performance of the semiconductor device structure 100 with the conductive plugs 315, 316, 317, and 318 is improved.

In some embodiments, a height H1 of the conductive plug 315 is greater than a height H2 of the conductive via structure 311, as shown in FIG. 1R. In some embodiments, a height H3 of the conductive plug 317 is greater than a height H4 of the conductive via structure 312. In some embodiments, a ratio of the height H1 of the conductive plug 315 to the height H2 of the conductive via structure 311 is equal to or greater than about 2. In some embodiments, the height H1 ranges from about 200 nm to about 400 nm.

In some embodiments, a maximum width W1 of the conductive plug 315 is greater than a maximum width W2 of the conductive via structure 311. In some embodiments, a ratio of the maximum width W1 to the maximum width W2 ranges from about 2 to about 10. The maximum width W1 ranges from about 10 nm to about 100 nm, in accordance with some embodiments. In some embodiments, a maximum width W3 of the conductive plug 317 is greater than a maximum width W4 of the conductive via structure 312. In some embodiments, a distance D5 between the conductive lines 335 and 337 is less than a distance D6 between the conductive lines 331 and 332.

The conductive plugs 315, 316, 317, and 318 have the same height, in accordance with some embodiments. That is, the height H1 is equal to the height H3, in accordance with some embodiments. In some embodiments, the height of the conductive plug 315, 316, 317, or 318 is greater than a sum of thicknesses TH1, TH2, TH3, TH4, TH5, and TH6 of the dielectric layers 140, 170, 210, 240, 270, and 290. The thickness TH1, TH2, TH3, TH4, TH5, or TH6 ranges from about 600 Å to about 800 Å, in accordance with some embodiments. Since each of the thicknesses TH1, TH2, TH3, TH4, TH5, and TH6 is small, the aspect ratio of the through hole A1, A2, A3, or A4 passing through the dielectric layers 140, 170, 210, 240, 270, and 290 is able to be maintained in a suitable range. The conductive plug 315, 316, 317, and 318 are in direct contact with the semiconductor substrate 110, in accordance with some embodiments.

In some embodiments, the aspect ratio of the through holes A1, A2, A3, or A4 or the ratio of the height H1 to the maximum width W1 ranges from about 2 to about 10. In some embodiments, conductive plugs are electrically connected to the respective gate electrodes 134 of the transistors T1, T2, T3, and T4, and the detailed description is described as follows.

Figures 1, 1R:
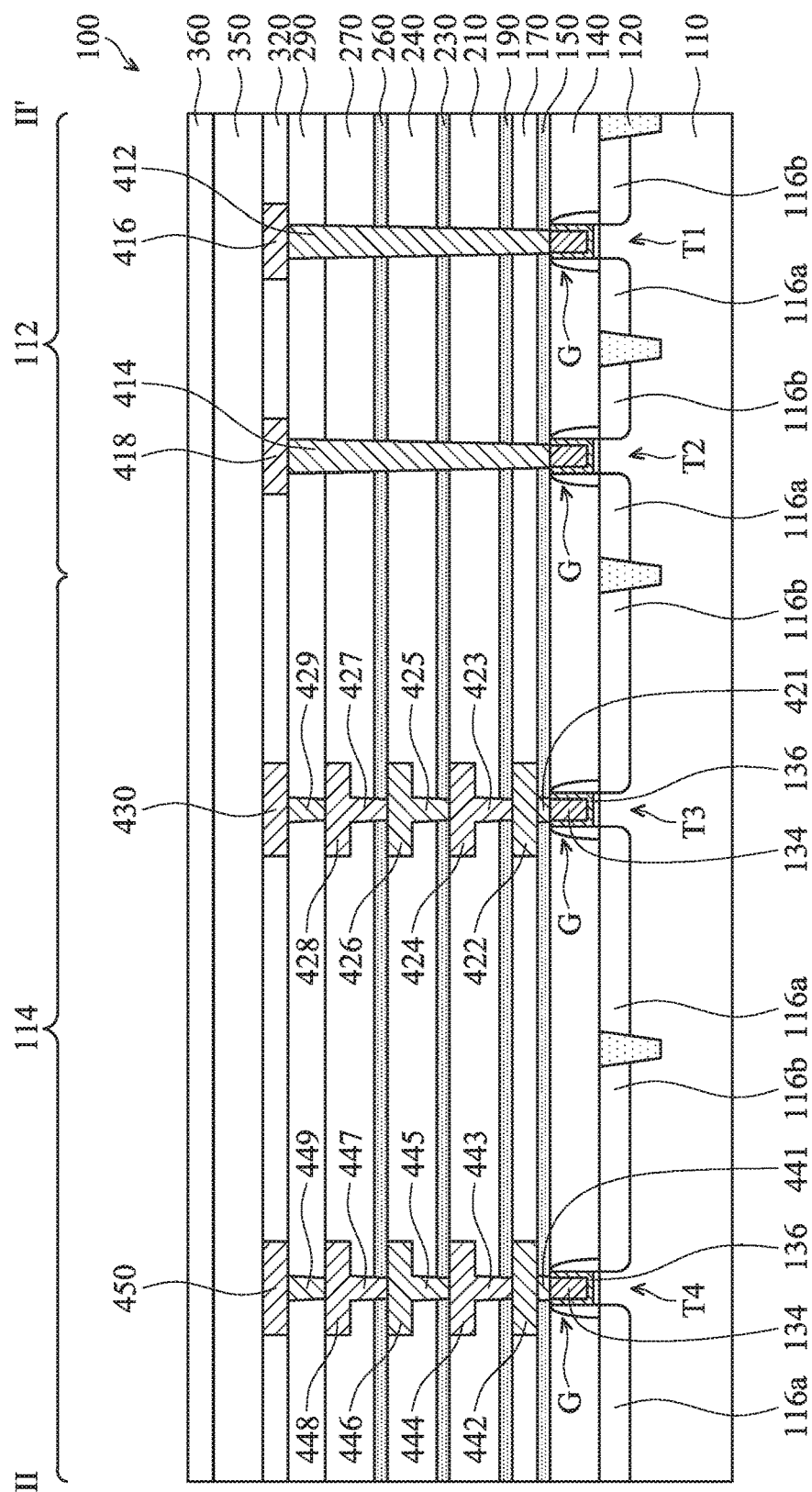
Figures 1, 1R, 2:
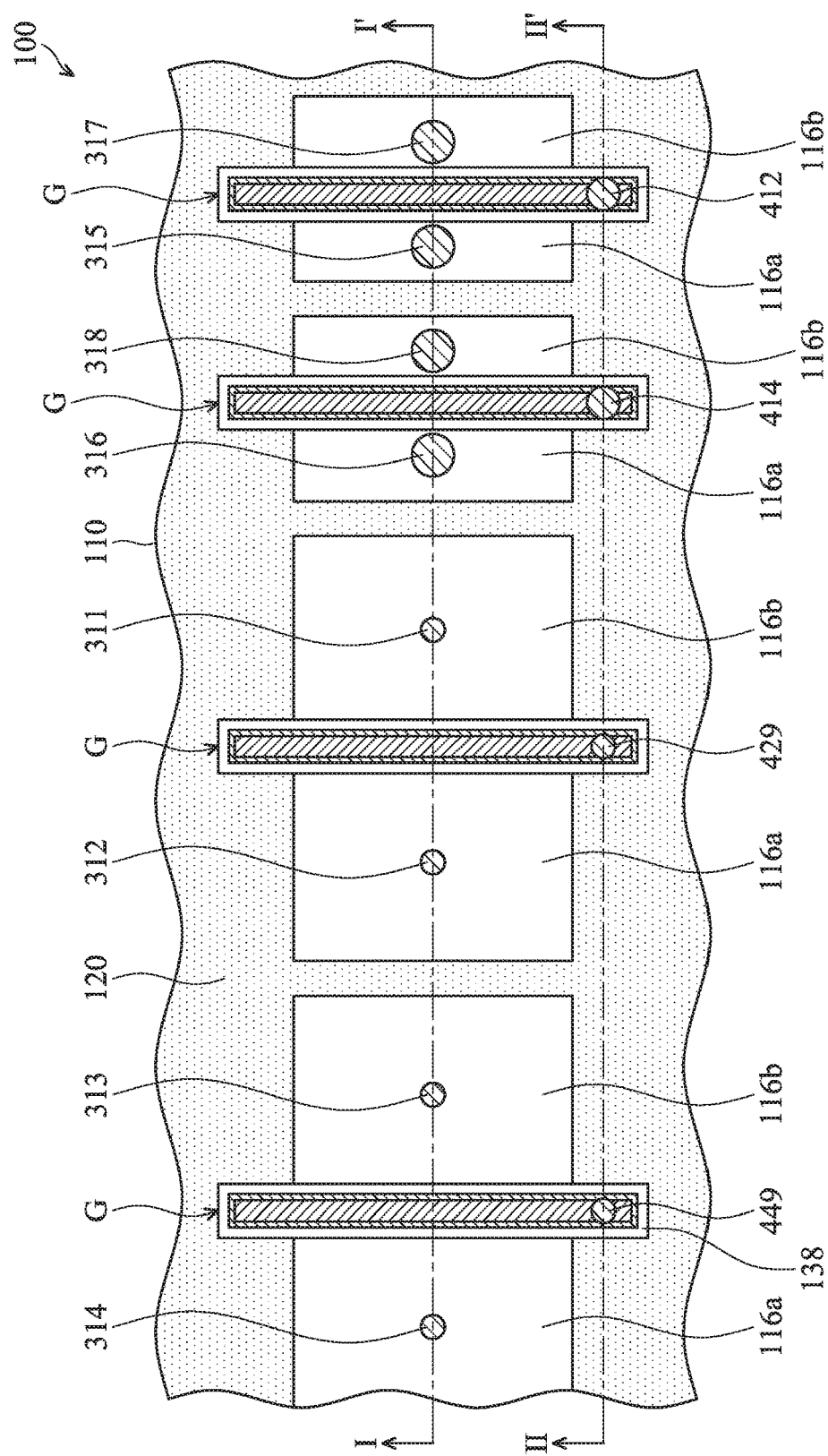
Figure 2:
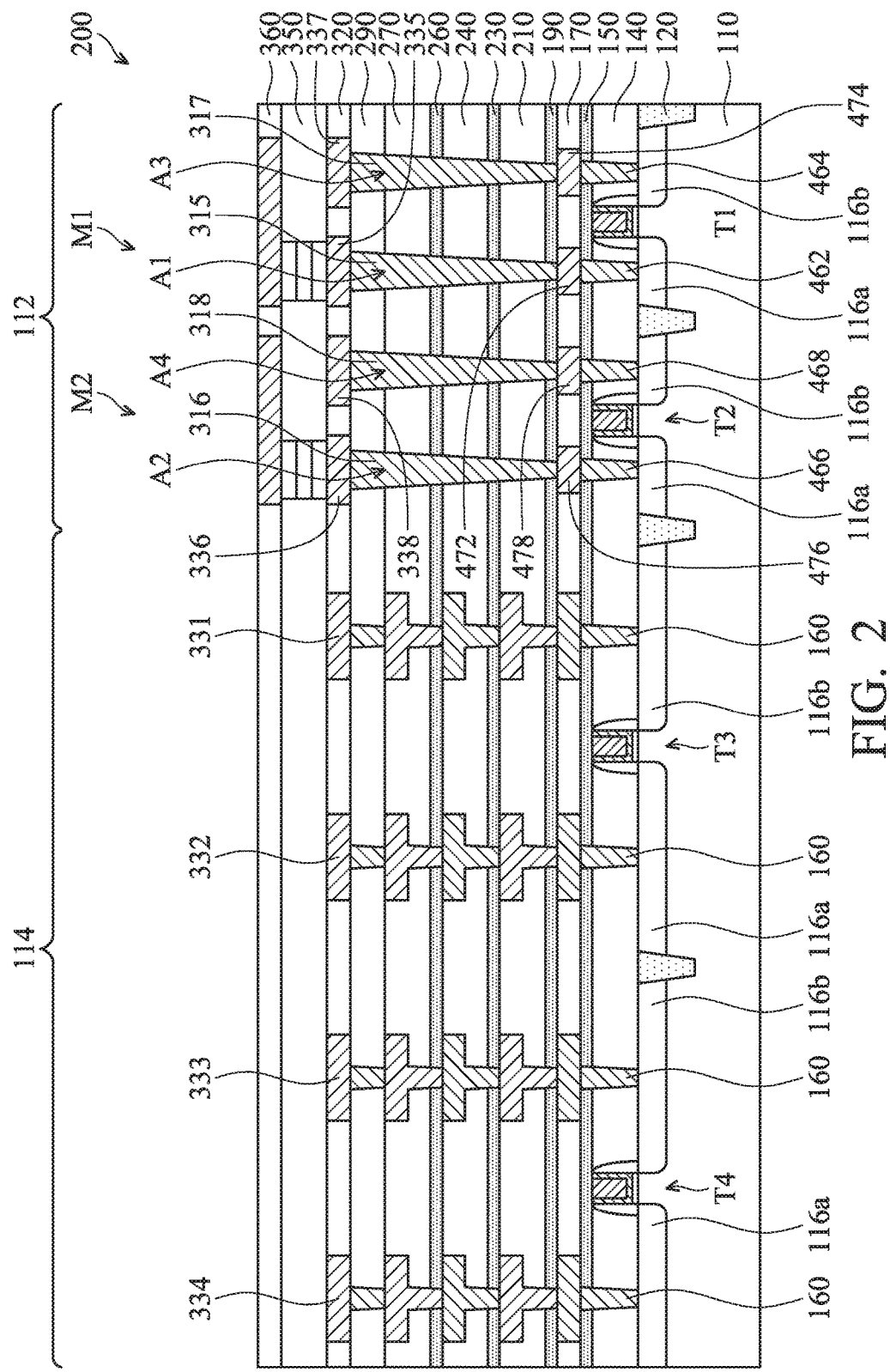

FIG. 1R-1 is another cross-sectional view of the semiconductor device structure 100, in accordance with some embodiments. FIG. 1R-2 is a top view of the semiconductor device structure 100, in accordance with some embodiments.

For simplicity, FIG. 1R-2 only shows the semiconductor substrate 110, the isolation structure 120, the first doped regions 116a, the second doped regions 116b, the gate stacks G, the spacer layers 138, the conductive plugs 315, 316, 317, 318, 412, and 414, and the conductive via structures 311, 312, 313, 314, 429, and 449, in accordance with some embodiments.

FIG. 1R is a cross-sectional view illustrating the semiconductor device structure 100 along a sectional line I-I' in FIG. 1R-2, in accordance with some embodiments. FIG. 1R-1 is a cross-sectional view illustrating the semiconductor device structure 100 along a sectional line II-II' in FIG. 1R-2, in accordance with some embodiments.

As shown in FIGS. 1R-1 and 1R-2, the semiconductor device structure 100 further includes conductive plugs 412 and 414, conductive lines 416, 418, 422, 424, 426, 428, 430, 442, 444, 446, 448, and 450, and conductive via structures 421, 423, 425, 427, 429, 441, 443, 445, 447, and 449, in accordance with some embodiments.

The conductive plugs 412 and 414 pass through the dielectric layers 140, 170, 210, 240, 270, and 290 and the etch stop layers 150, 190, 230, and 260, in accordance with some embodiments. The conductive plugs 412 and 414 are electrically connected to the respective gate electrodes 134 of the transistors T1 and T2, in accordance with some embodiments. In some embodiments, the conductive plugs 412 and 414 are formed during the formation of the conductive plugs 315, 316, 317, and 318.

The conductive lines 416 and 418 are formed in the dielectric layer 320, in accordance with some embodiments. The conductive via structures 421 and 441 are formed in the etch stop layer 150 and electrically connected to the respective gate electrodes 134 of the transistors T3 and T4, in accordance with some embodiments. The conductive lines 422 and 442 are formed in the dielectric layer 170 and electrically connected to the respective conductive via structures 421 and 441, in accordance with some embodiments.

The conductive via structures 423 and 443 are formed in the etch stop layer 190 and the dielectric layer 210 and electrically connected to the respective conductive lines 422 and 442, in accordance with some embodiments. The conductive lines 424 and 444 are formed in the dielectric layer 210 and electrically connected to the respective conductive via structures 423 and 443, in accordance with some embodiments.

The conductive via structures 425 and 445 are formed in the etch stop layer 230 and the dielectric layer 240 and electrically connected to the respective conductive lines 424 and 444, in accordance with some embodiments. The conductive lines 426 and 446 are formed in the dielectric layer 240 and electrically connected to the respective conductive via structures 425 and 445, in accordance with some embodiments.

The conductive via structures 427 and 447 are formed in the etch stop layer 260 and the dielectric layer 270 and electrically connected to the respective conductive lines 426 and 446, in accordance with some embodiments. The conductive lines 428 and 448 are formed in the dielectric layer 270 and electrically connected to the respective conductive via structures 427 and 447, in accordance with some embodiments.

The conductive via structures 429 and 449 are formed in the dielectric layer 290 and electrically connected to the respective conductive lines 428 and 448, in accordance with some embodiments. The conductive lines 430 and 450 are formed in the dielectric layer 320 and electrically connected to the respective conductive via structures 429 and 449, in accordance with some embodiments.

FIG. 2 is a cross-sectional view of a semiconductor device structure 200, in accordance with some embodiments. As shown in FIG. 2, the semiconductor device structure 200 is similar to the semiconductor device structure 100, except that the semiconductor device structure 200 further includes conductive contact structures 462, 464, 466, and 468, and conductive lines 472, 474, 476, and 478, in accordance with some embodiments.

The conductive contact structures 462, 464, 466, and 468 pass through the dielectric layer 140 and the etch stop layer 150, in accordance with some embodiments. The conductive contact structures 462, 464, 466, and 468 are electrically connected to the first doped regions 116a and the second doped regions 116b of the transistors T1 and T2, respectively, in accordance with some embodiments.

The conductive lines 472, 474, 476, and 478 are formed in the dielectric layer 170, in accordance with some embodiments. The conductive line 472 electrically connects the conductive plug 315 to the conductive contact structure 462, in accordance with some embodiments. The conductive line 474 electrically connects the conductive plug 317 to the conductive contact structure 464, in accordance with some embodiments. The conductive line 476 electrically connects the conductive plug 316 to the conductive contact structure 466, in accordance with some embodiments. The conductive line 478 electrically connects the conductive plug 318 to the conductive contact structure 468, in accordance with some embodiments.

The conductive plugs 315, 316, 317, and 318 pass through the dielectric layers 210, 240, 270, and 290 and the etch stop layers 190, 230, and 260, in accordance with some embodiments. In some embodiments, the conductive plugs 315, 316, 317, and 318 pass through more than two dielectric layers. The through holes A1, A2, A3, and A4 pass through the dielectric layers 210, 240, 270, and 290 and expose the conductive lines 472, 476, 474, and 478, respectively, in accordance with some embodiments.

In accordance with some embodiments, semiconductor device structures and methods for forming the same are provided. The methods (for forming the semiconductor device structure) form conductive plugs passing through dielectric layers to reduce the number of the photomasks required. As a result, the formation of the conductive plugs reduces the cost of the process for forming the semiconductor device structure.

In accordance with some embodiments, a semiconductor device structure is provided. The semiconductor device structure includes a semiconductor substrate. The semiconductor device structure includes a first conductive plug and a second conductive plug over the semiconductor substrate and adjacent to each other. The semiconductor device structure includes a first conductive via structure and a second conductive via structure over the semiconductor substrate and adjacent to each other. A first distance between the first conductive plug and the second conductive plug is less than a second distance between the first conductive via structure and the second conductive via structure. A first height of the first conductive plug is greater than a second height of the first conductive via structure.

In accordance with some embodiments, a semiconductor device structure is provided. The semiconductor device structure includes a semiconductor substrate. The semiconductor device structure includes a first dielectric layer over the semiconductor substrate. The semiconductor device structure includes a second dielectric layer over the first dielectric layer. The semiconductor device structure includes a first conductive plug and a second conductive plug adjacent to each other and individually passing through the first dielectric layer and the second dielectric layer. The semiconductor device structure includes a first conductive via structure and a second conductive via structure in the first dielectric layer but not in the second dielectric layer. The first conductive via structure and the second conductive via structure are adjacent to each other. A first distance between the first conductive plug and the second conductive plug is less than a second distance between the first conductive via structure and the second conductive via structure.

In accordance with some embodiments, a method for forming a semiconductor device structure is provided. The method includes forming a first dielectric layer over a semiconductor substrate. The method includes forming a second dielectric layer over the first dielectric layer. The method includes forming a first via and a second via passing through the second dielectric layer. The method includes forming a first through hole and a second through hole passing through the first dielectric layer and the second dielectric layer. The method includes forming a first conductive via structure, a second conductive via structure, a first conductive plug, and a second conductive plug in the first via, the second via, the first through hole, and the second through hole respectively. A first distance between the first conductive plug and the second conductive plug is less than a second distance between the first conductive via structure and the second conductive via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a first conductive plug and a second conductive plug over the semiconductor substrate and adjacent to each other;
a first conductive via structure and a second conductive via structure over the semiconductor substrate and adjacent to each other, wherein a first distance between the first conductive plug and the second conductive plug is less than a second distance between the first conductive via structure and the second conductive via structure, a first height of the first conductive plug is greater than a second height of the first conductive via structure, and a first top surface of the first conductive via structure and a second top surface of the first conductive plug are coplanar;
a first conductive line connected to the first conductive plug;
a second conductive line connected to the second conductive plug;
a third conductive line connected to the first conductive via structure; and
a fourth conductive line connected to the second conductive via structure, wherein a third top surface of the first conductive line, a fourth top surface of the second conductive line, a fifth top surface of the third conductive line, and a sixth top surface of the fourth conductive line are coplanar.

2. The semiconductor device structure as claimed in claim 1, wherein a first maximum width of the first conductive plug is greater than a second maximum width of the first conductive via structure.

3. The semiconductor device structure as claimed in claim 2, wherein a third maximum width of the second conductive plug is greater than a fourth maximum width of the second conductive via structure.

4. The semiconductor device structure as claimed in claim 1, wherein a third height of the second conductive plug is greater than a fourth height of the second conductive via structure.

5. The semiconductor device structure as claimed in claim 1, wherein a first top surface of the first conductive plug is aligned with a second top surface of the second conductive plug.

6. The semiconductor device structure as claimed in claim 1, wherein a ratio of the first height of the first conductive plug to the second height of the first conductive via structure is equal to or greater than about 2.

7. The semiconductor device structure as claimed in claim 1,
wherein a third distance between the first conductive line and the second conductive line is less than a fourth distance between the third conductive line and the fourth conductive line.

8. The semiconductor device structure as claimed in claim 1, wherein the first top surface of the first conductive via structure, the second top surface of the first conductive plug, a third top surface of the second conductive via structure, and a fourth top surface of the second conductive plug are coplanar.

9. A semiconductor device structure, comprising:
a semiconductor substrate;
a first dielectric layer over the semiconductor substrate;
a second dielectric layer over the first dielectric layer;
a first conductive plug and a second conductive plug adjacent to each other and passing through the first dielectric layer and the second dielectric layer;
a first conductive via structure and a second conductive via structure in the second dielectric layer but not in the first dielectric layer, wherein the first conductive via structure and the second conductive via structure are adjacent to each other, a first distance between the first conductive plug and the second conductive plug is less than a second distance between the first conductive via structure and the second conductive via structure, and a first maximum width of the first conductive plug is greater than a second maximum width of the first conductive via structure;
an etch stop layer between the first dielectric layer and the second dielectric layer, wherein the first conductive plug and the second conductive plug pass through the etch stop layer; and
a first transistor comprising a first gate electrode, a first source region, and a first drain region, wherein the first gate electrode is over the semiconductor substrate, the first source region and the first drain region are in the semiconductor substrate and positioned at two opposite sides of the first gate electrode, the first conductive plug and the second conductive plug are on and electrically connected to the first source region and the first drain region respectively, and the etch stop layer is in direct contact with the first gate electrode.

10. The semiconductor device structure as claimed in claim 9, further comprising:
a second transistor comprising a second gate electrode, a second source region, and a second drain region, wherein the second gate electrode is over the semiconductor substrate, the second source region and the second drain region are in the semiconductor substrate and positioned at two opposite sides of the second gate electrode, the first conductive via structure and the second conductive via structure are over and electrically connected to the second source region and the second drain region respectively, and the etch stop layer is further in direct contact with the second gate electrode.

11. The semiconductor device structure as claimed in claim 10, wherein the first conductive plug and the second conductive plug are electrically connected to the source region and the drain region respectively.

12. The semiconductor device structure as claimed in claim 9, wherein the first conductive plug and the second conductive plug have a same height.

13. The semiconductor device structure as claimed in claim 9, wherein a height of the first conductive plug is greater than a sum of a first thickness of the first dielectric layer and a second thickness of the second dielectric layer.

14. The semiconductor device structure as claimed in claim 9, wherein the first conductive plug and the second conductive plug are in direct contact with the semiconductor substrate, and a first top surface of the first conductive via structure, a second top surface of the first conductive plug, a third top surface of the second conductive via structure, and a fourth top surface of the second conductive plug are coplanar.

15. A semiconductor device structure, comprising:
a semiconductor substrate;
a first dielectric layer over the semiconductor substrate;
a second dielectric layer over the first dielectric layer;
a first conductive plug and a second conductive plug adjacent to each other and passing through the first dielectric layer and the second dielectric layer, wherein the first conductive plug is in direct contact with the semiconductor substrate;
a first conductive via structure and a second conductive via structure in the second dielectric layer but not in the first dielectric layer, wherein the first conductive via structure and the second conductive via structure are adjacent to each other, and a first distance between the first conductive plug and the second conductive plug is less than a second distance between the first conductive via structure and the second conductive via structure;
a third conductive via structure in the first dielectric layer and under the first conductive via structure, wherein the third conductive via structure is electrically connected to the first conductive via structure, and a first height of the first conductive plug is greater than a sum of a second height of the first conductive via structure and a third height of the third conductive via structure; and
a first etch stop layer between the first dielectric layer and the second dielectric layer, wherein the first conductive plug, the second conductive plug, the first conductive via structure, and the second conductive via structure pass through the first etch stop layer, the first etch stop layer and the first dielectric layer are made of different materials, and the first etch stop layer and the second dielectric layer are made of different materials.

16. The semiconductor device structure as claimed in claim 15, further comprising:
a fourth conductive via structure in the first dielectric layer and under the second conductive via structure, wherein the fourth conductive via structure is electrically connected to the second conductive via structure, and the first height of the first conductive plug is greater than a sum of a fourth height of the second conductive via structure and a fifth height of the fourth conductive via structure.

17. The semiconductor device structure as claimed in claim 16, further comprising:
a second etch stop layer under the first etch stop layer, wherein the first conductive plug, the second conductive plug, the third conductive via structure, and the fourth conductive via structure pass through the second etch stop layer, the third conductive via structure and the fourth conductive via structure do not extend into the first etch stop layer, the second etch stop layer and the first dielectric layer are made of different materials, and the second etch stop layer and the second dielectric layer are made of different materials; and
a transistor comprising a gate electrode, a source region, and a drain region, wherein the gate electrode is over the semiconductor substrate, the source region and the drain region are in the semiconductor substrate and positioned at two opposite sides of the gate electrode, the first conductive plug and the second conductive plug are on and electrically connected to the source region and the drain region respectively, and the second etch stop layer is in direct contact with the gate electrode.

18. The semiconductor device structure as claimed in claim 15, further comprising:
a conductive line between the first conductive via structure and the third conductive via structure, wherein the conductive line electrically connects the first conductive via structure to the third conductive via structure, and the first height of the first conductive plug is greater than a sum of a fourth height of the conductive line, the second height of the first conductive via structure, and the third height of the third conductive via structure.

19. The semiconductor device structure as claimed in claim 15, further comprising:
a first transistor comprising a first gate electrode, a first source region, and a first drain region, wherein the first gate electrode is over the semiconductor substrate, the first source region and the first drain region are in the semiconductor substrate and positioned at two opposite sides of the first gate electrode, the first conductive plug and the second conductive plug are on and electrically connected to the first source region and the first drain region respectively, and the second conductive plug is in direct contact with the semiconductor substrate.

20. The semiconductor device structure as claimed in claim 19, further comprising:
a second transistor comprising a second gate electrode, a second source region, and a second drain region, wherein the second gate electrode is over the semiconductor substrate, the second source region and the second drain region are in the semiconductor substrate and positioned at two opposite sides of the second gate electrode, the first conductive via structure and the third conductive via structure are over and electrically connected to the second source region, and the second conductive via structure is over and electrically connected to the second drain region.

* * * * *